(12) United States Patent
Sutardja et al.

(10) Patent No.: US 7,340,644 B2
(45) Date of Patent: Mar. 4, 2008

(54) SELF-REPARABLE SEMICONDUCTOR AND METHOD THEREOF

(75) Inventors: Sehat Sutardja, Los Altos Hills, CA (US); Pantas Sutardja, San Jose, CA (US); William Lo, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 612 days.

(21) Appl. No.: 10/892,707

(22) Filed: Jul. 16, 2004

(65) Prior Publication Data

US 2005/0015660 A1    Jan. 20, 2005

Related U.S. Application Data

(63) Continuation-in-part of application No. 10/358,709, filed on Feb. 5, 2003, now Pat. No. 7,185,225.

(60) Provisional application No. 60/531,023, filed on Dec. 18, 2003, provisional application No. 60/430,199, filed on Dec. 2, 2002.

(51) Int. Cl.
*G06F 11/00* (2006.01)

(52) U.S. Cl. .......................... 714/11; 714/13

(58) Field of Classification Search .................. 714/13, 714/11, 2
See application file for complete search history.

(56) References Cited

U.S. PATENT DOCUMENTS

| | | |
|---|---|---|
| 4,566,102 A | 1/1986 | Hefner |
| 4,933,895 A | 6/1990 | Grinberg et al. ............ 708/509 |
| 5,204,836 A | 4/1993 | Reed |
| 5,423,024 A | 6/1995 | Cheung |
| 5,634,067 A | 5/1997 | Nagazumi ..................... 712/19 |
| 5,655,069 A | 8/1997 | Ogawara et al. |
| 5,737,766 A | 4/1998 | Tan |
| 5,748,872 A | 5/1998 | Norman |
| 6,145,072 A | 11/2000 | Shams et al. |
| 6,256,758 B1 | 7/2001 | Abramovici et al. |
| 6,337,817 B1 | 1/2002 | Horiguchi et al. |
| 6,363,021 B2 | 3/2002 | Noh |
| 6,526,461 B1 | 2/2003 | Cliff ........................... 710/100 |
| 6,697,979 B1 | 2/2004 | Vorbach et al. |

(Continued)

FOREIGN PATENT DOCUMENTS

EP    0 361 404    4/1990

(Continued)

OTHER PUBLICATIONS

Communication dated Jun. 6, 2005 from the European Patent Office for European Patent Application No. 03026882.5-2211.

(Continued)

*Primary Examiner*—Marc Duncan

(57) ABSTRACT

A self-reparable semiconductor includes multiple functional units that perform the same function and that include sub-functional units. The semiconductor includes one or more full or partial spare functional units that are integrated into the semiconductor. If a defect in a sub-functional unit is detected, then that sub-functional unit is switched out and replaced with a sub-functional unit in the full or partial spare functional unit. The reconfiguration is realized with switching devices that are associated with the sub-functional units. Defective functional or sub-functional units can be detected after assembly, during power up, periodically during operation, and/or manually.

76 Claims, 24 Drawing Sheets

U.S. PATENT DOCUMENTS

| | | | |
|---|---|---|---|
| 6,775,529 | B1 | 8/2004 | Roo |
| 6,785,841 | B2* | 8/2004 | Akrout et al. ............... 714/11 |
| 6,816,143 | B1 | 11/2004 | Lambert |
| 7,117,389 | B2* | 10/2006 | Luick ........................ 714/11 |
| 2002/0133690 | A1 | 9/2002 | Yano et al. |
| 2003/0005377 | A1* | 1/2003 | Debenham ................ 714/724 |
| 2003/0177425 | A1* | 9/2003 | Okin ........................ 714/724 |
| 2004/0123181 | A1* | 6/2004 | Moon et al. ................ 714/13 |
| 2004/0153754 | A1* | 8/2004 | Chen et al. ................. 714/13 |
| 2004/0177298 | A1* | 9/2004 | Farnworth et al. .......... 714/724 |
| 2004/0193939 | A1* | 9/2004 | Tanaka et al. ................ 714/2 |

FOREIGN PATENT DOCUMENTS

| | | |
|---|---|---|
| EP | 0 398 552 | 11/1990 |
| EP | 1 170 666 A2 | 1/2002 |
| EP | 1 170 666 A3 | 6/2002 |
| WO | WO 99/32975 | 7/1999 |
| WO | WO 01/39163 | 5/2001 |

OTHER PUBLICATIONS

Notification of First Office Action dated Nov. 25, 2005 for Chineses Patent Application No. 03134804.1; 7 pages.

Wang, Minghsien; Cutler, Michal; Su, Stephen Y.H.; Reconfiguration of VLSI/WSI Mesh Array Processors with Two-Level Redundancy, 1989, IEEE, pp. 547-550.

IBM Technical Disclosure Bulletin, Yield and Reliability Enhancement Via Redundancy for VLSI Chips and Wafers, Jun. 1, 1985, pp. 1 and 2.

Notification of First Office Action from the State Intellectual Property Office of PRC dated Mar. 23, 2007 for Chinese Application No. 200410073737.2; 7 pages.

* cited by examiner

| MUX_ST | MUX_CR | Function |
|---|---|---|
| 0 | 0 | Physical Port Not Used |
| 0 | 1 | Route Group From Physical Port n to Pin of Logical Port (n-1) |
| 1 | 0 | Route Group From Physical Port n to Pin of Logical Port n |
| 1 | 1 | NOT USED |

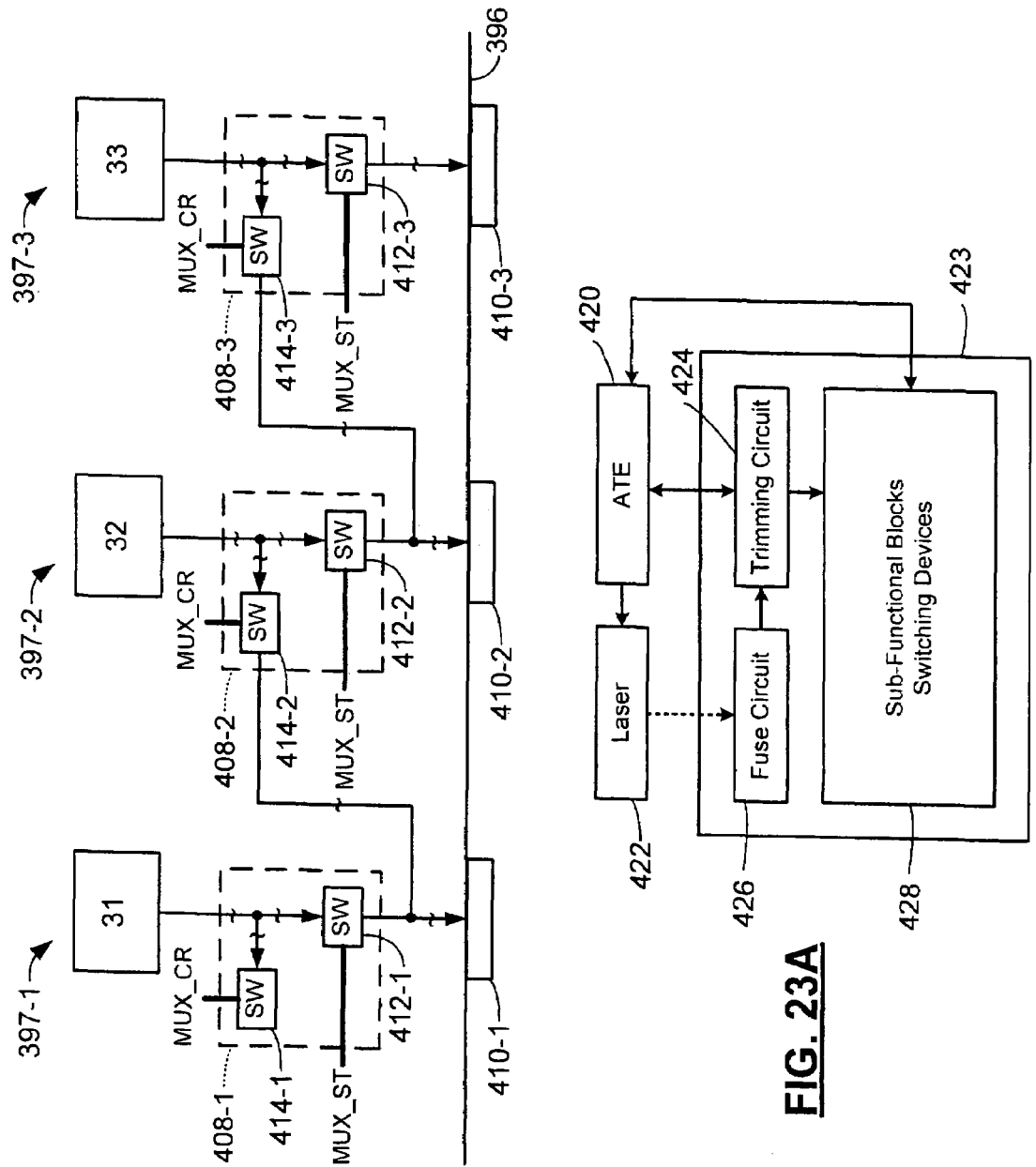

| TRIM[3:0] | SKIP[3:0] | Bits To Zap | Disabled Port |
|---|---|---|---|
| 0 | 8 | 0 | Port 8 |
| 1 | 1 | 1 | Port 1 |
| 2 | 2 | 1 | Port 2 |
| 3 | 3 | 2 | Port 3 |
| 4 | 4 | 1 | Port 4 |
| 5 | 5 | 2 | Port 5 |
| 6 | 6 | 2 | Port 6 |
| 7 | 7 | 3 | NOT USED |
| 8 | 0 | 1 | Port 0 |
| 9 | 7 | 2 | NOT USED |
| 10 | 2 | 2 | NOT USED |
| 11 | 7 | 3 | NOT USED |
| 12 | 4 | 2 | NOT USED |
| 13 | 7 | 3 | NOT USED |
| 14 | 6 | 3 | NOT USED |
| 15 | 7 | 4 | NOT USED |

FIG. 24

| Fuse | Port | Block |
|---|---|---|
| TRIM_P1 | SKIP_P1[3:0] | PHY P1 Group |
| TRIM_P2 | SKIP_P2[3:0] | PHY P2 Group |
| TRIM_P3 | SKIP_P3[3:0] | PHY P3 Group |

FIG. 25

| Control Signal | Equation |
|---|---|
| SKIP_P1 | SKIP_P1[3:0] == PORT_SLICE[3:0] |
| SKIP_P3 | SKIP_P3[3:0] == PORT_SLICE[3:0] |
| MUX_ST_P1 | SKIP_P1[3:0] > PORT_SLICE[3:0] |
| MUX_CR_P1 | SKIP_P1[3:0] < PORT_SLICE[3:0] |
| MUX_ST_P3 | SKIP_P3[3:0] > PORT_SLICE[3:0] |
| MUX_CR_P3 | SKIP_P3[3:0] < PORT_SLICE[3:0] |
| NE_SW_P2 | (SKIP_P2[3:0] == PORT_SLICE[3:0]) \|\| ((SKIP_P1[3:0] <= PORT_SLICE[3:0]) && (SKIP_P2[3:0] > PORT_SLICE[3:0])) |
| NW_SE_P2 | (SKIP_P2[3:0] == PORT_SLICE[3:0]) \|\| ((SKIP_P1[3:0] >= PORT_SLICE[3:0]) && (SKIP_P2[3:0] < PORT_SLICE[3:0])) |
| SE_NW_P2 | (SKIP_P2[3:0] == PORT_SLICE[3:0]) \|\| ((SKIP_P1[3:0] <= PORT_SLICE[3:0]) && (SKIP_P2[3:0] > PORT_SLICE[3:0])) |
| SW_NE_P2 | (SKIP_P2[3:0] == PORT_SLICE[3:0]) \|\| ((SKIP_P1[3:0] >= PORT_SLICE[3:0]) && (SKIP_P2[3:0] < PORT_SLICE[3:0])) |
| NE_SW_P3 | (SKIP_P3[3:0] == PORT_SLICE[3:0]) \|\| ((SKIP_P1[3:0] <= PORT_SLICE[3:0]) && (SKIP_P3[3:0] > PORT_SLICE[3:0])) |
| NW_SE_P3 | (SKIP_P3[3:0] == PORT_SLICE[3:0]) \|\| ((SKIP_P1[3:0] >= PORT_SLICE[3:0]) && (SKIP_P3[3:0] < PORT_SLICE[3:0])) |
| SE_NW_P3 | (SKIP_P3[3:0] == PORT_SLICE[3:0]) \|\| ((SKIP_P1[3:0] <= PORT_SLICE[3:0]) && (SKIP_P3[3:0] > PORT_SLICE[3:0])) |
| SW_NE_P3 | (SKIP_P3[3:0] == PORT_SLICE[3:0]) \|\| ((SKIP_P1[3:0] >= PORT_SLICE[3:0]) && (SKIP_P3[3:0] < PORT_SLICE[3:0])) |

FIG. 26

| | SKIP < PORT | SKIP = PORT | SKIP > PORT |
|---|---|---|---|
| I/O Connection | ST = 0<br>CR = 1<br>↙ or ↗ | ST = 0<br>CR = 0<br>✕ | ST = 1<br>CR = 0<br>↔ |

FIG. 27

SELF-REPARABLE SEMICONDUCTOR AND METHOD THEREOF

CROSS-REFERENCE TO RELATED APPLICATIONS

This application is a continuation-in-part of U.S. patent application Ser. No. 10/358,709, filed on Feb. 5, 2003 now U.S. Pat. No. 7,185,225, which claims the benefit of U.S. Provisional Application No. 60/430,199, filed on Dec. 2, 2002. This application also claims the benefit of U.S. Provisional Application No. 60/531,023, filed on Dec. 18, 2003. The disclosures of the above applications are all incorporated herein by reference.

FIELD OF THE INVENTION

The present invention relates to semiconductors, and more particularly to a self-reparable semiconductor with multiple functional units that perform the same function.

BACKGROUND OF THE INVENTION

An increasing trend in the semiconductor industry is to highly integrate an integrated circuit multiple times. For example, the semiconductor may include multiple generally independent functional units that perform the same function. Each functional unit has the same sub-functional units.

Referring now to FIG. 1, a semiconductor 8 includes M generally independent functional units 10-1, 10-2, . . . , and 10-M (collectively referred to as functional units 10) that perform the same high level function. Each functional unit 10 includes the same N sub-functional units. For example, the functional unit 10-1 includes sub-functional units 11, 21, 31, . . . , and N1. The functional unit 10-2 includes sub-functional units 12, 22, 32, . . . , and N2. The functional unit 10-M includes sub-functional units 1M, 2M, 3M, . . . , and NM. The sub-functional units in a row perform the same low level function. Typically, there are no connections between the functional units other than ground and power. There are, however, connections between the sub-functional units in a functional unit. The connections may be one-way or two-way and may include one or more connecting wires.

Referring now to FIG. 2, an exemplary functional unit may be a Gigabit physical layer device 70. For example, four or eight Gigabit physical layer devices may be fabricated on the semiconductor. The physical layer device 70 includes a first sub-functional unit 74 that performs physical coding sub-layer (PQS), FCT, and Decision Feedback Sequence Estimation (DFSE) functions. A second sub-functional unit 76 implements a finite impulse response (FIR) filter function. A third sub-functional unit 78 performs echo and near end crosstalk (NEXT) functions. Fourth and fifth sub-functional units 80 and 84 implement digital and analog front end (AFE) functions, respectively.

If the yield for each individual functional unit is 90%, then the yield for the semiconductor with x identical functional units is $(0.9)^x$. For example, if a semiconductor includes eight functional units each having a yield of 90%, the yield of the semiconductor is 43%, which is not an acceptable yield.

SUMMARY OF THE INVENTION

A self-reparable semiconductor comprises a first functional unit including first, second, and third sub-functional units that cooperate to perform a first function. The first sub-functional unit communicates with at least one of the second and/or third sub-functional units and the second sub-functional unit communicates with at least one of the first and/or third sub-functional units. A first spare functional unit includes first, second, and third sub-functional units. The first, second, and third sub-functional units of the first functional unit and the first spare functional unit, respectively, are functionally interchangeable. Switching devices communicate with the first, second, and third sub-functional units of the first functional unit and the first spare functional unit and replace at least one of the first, second, and third sub-functional units of the first functional unit with at least one of the first, second, and third sub-functional units of the first spare functional unit when the at least one of the first, second, and third sub-functional units of the first functional unit is inoperable.

In other features, a controller identifies at least one inoperable sub-functional unit on the self-reparable semiconductor and generates configuration data for configuring the switching devices to replace the at least one inoperable sub-functional unit. The controller is located on the self-reparable semiconductor. The controller is located off of the self-reparable semiconductor. Memory that is located on the self-reparable semiconductor stores the configuration data for the switching devices.

In still other features, the first functional unit and the first spare functional unit are laid out in one of columns and rows on the self-reparable semiconductor and the first, second, and third sub-functional units of the first functional unit and the first spare functional unit are laid out in the other of columns and rows. A second functional unit that includes first, second, and third sub-functional units. The first, second, and third sub-functional units of the first and second functional units, respectively, are functionally interchangeable. The first spare functional unit is located one of between the first and second functional units and adjacent to one of the first or the second functional units.

In still other features, the first, second, and first spare functional units are laid out in one of columns and rows on the self-reparable semiconductor and the first, second, and third sub-functional units of the first, second, and first spare functional units are laid out in the other of columns and rows. At least one of the switching devices includes a multiplexer that receives y inputs and selectively outputs one of the y inputs. The multiplexer receives output signals from first, second, and third sub-functional units that are functionally interchangeable. At least one of the switching devices includes first and second switches that receive an input and that selectively output the input based on first and second control signals, respectively.

The switching devices include at least one of analog and digital switching devices. The analog switching devices are current-based. Signals that are communicated between the first and third sub-functional units of at least one of the first functional unit and the first spare functional unit are routed through the second sub-functional unit of the at least one of the first functional unit and/or the first spare functional unit.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 22 is a functional block diagram of three functional units of a self-reparable semiconductor including dual switch switching devices between respective third sub-functional units and output pads;

FIGS. 23A and 23B are functional block diagrams of a system, for locating inoperable sub-functional units and a trimming circuit, respectively;

FIG. 24 is a table that illustrates fuse mapping in a semiconductor verification process for a self-reparable semiconductor according to the present invention;

FIG. 25 is a table that illustrates trimming signals for identifying inoperable sub-functional units in a functional unit;

FIG. 26 is a table that illustrates functions for determining control signal values for switching devices in a self-reparable semiconductor;

FIG. 27 is a table that illustrates signal flow between sub-functional units and input and/or output pads and values of switching device control signals based on SKIP_* and PORT_SLICE signals;

DETAILED DESCRIPTION OF THE PREFERRED EMBODIMENTS

Figures 1, 2:
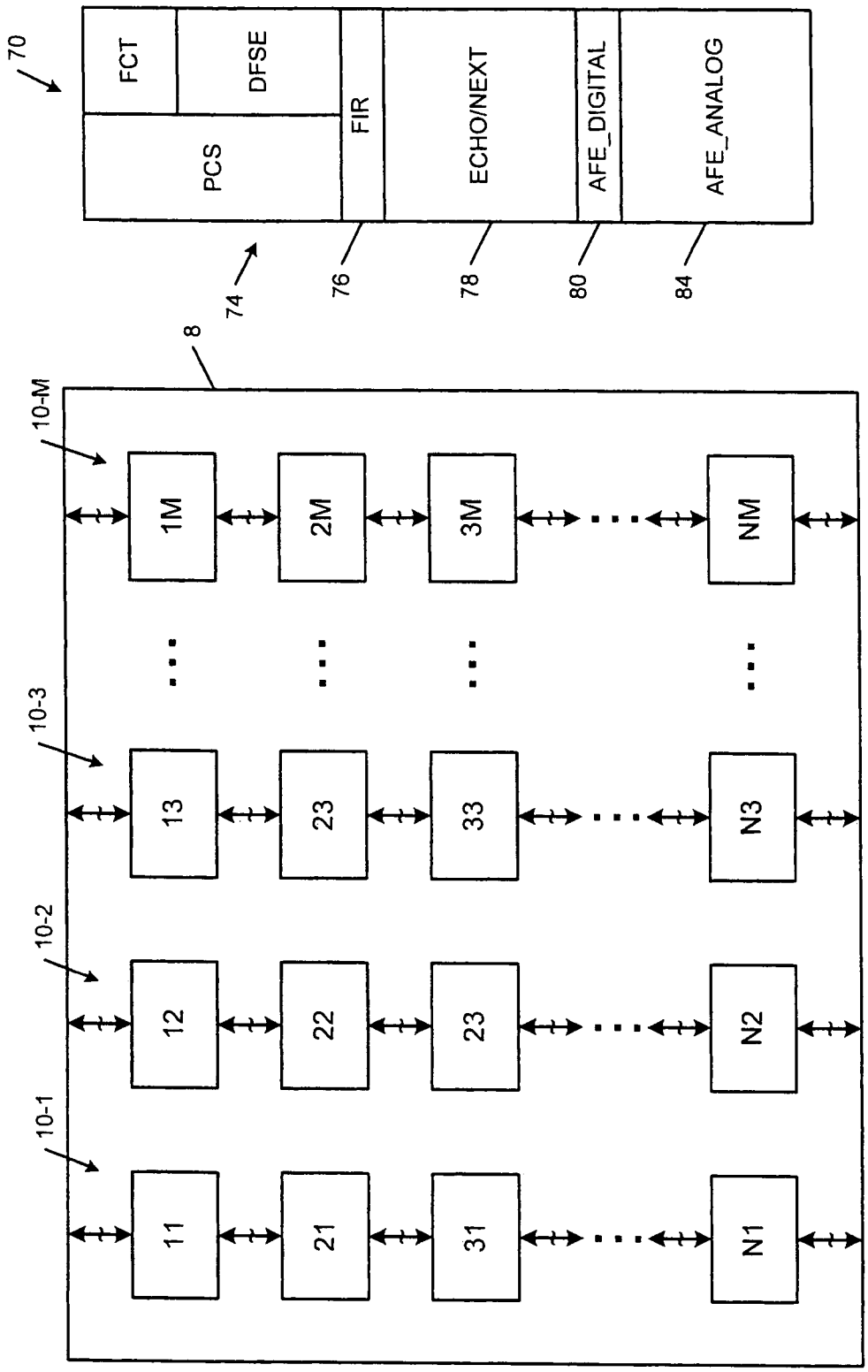
FIG. 1 is a functional block diagram of a semiconductor including multiple functional units each with sub-functional units according to the prior art.
FIG. 2 is a functional block diagram of an exemplary functional unit for a Gigabit physical layer device according to the prior art.

The following description of the preferred embodiment(s) is merely exemplary in nature and is in no way intended to limit the invention, its application, or uses. For purposes of clarity, the same reference numbers will be used in the drawings to identify similar elements.

A self-reparable semiconductor according to the present invention includes one or more full or partial spare functional units. If a defect in a functional unit or a sub-functional unit is detected, then that functional unit or sub-functional unit is switched out and replaced with a functional unit or sub-functional unit in the full or partial spare functional unit. The reconfiguration is realized with switching devices that may be integrated with or separate from the functional or sub-functional units.

Defective functional or sub-functional units can be detected after assembly, during power up, periodically during operation, and/or manually. While the present invention will be described in conjunction with specific examples, skilled artisans will appreciate that each semiconductor may include any number of functional units that perform the same high-level function. The functional units may include any number of common sub-functional units.

Figure 13:
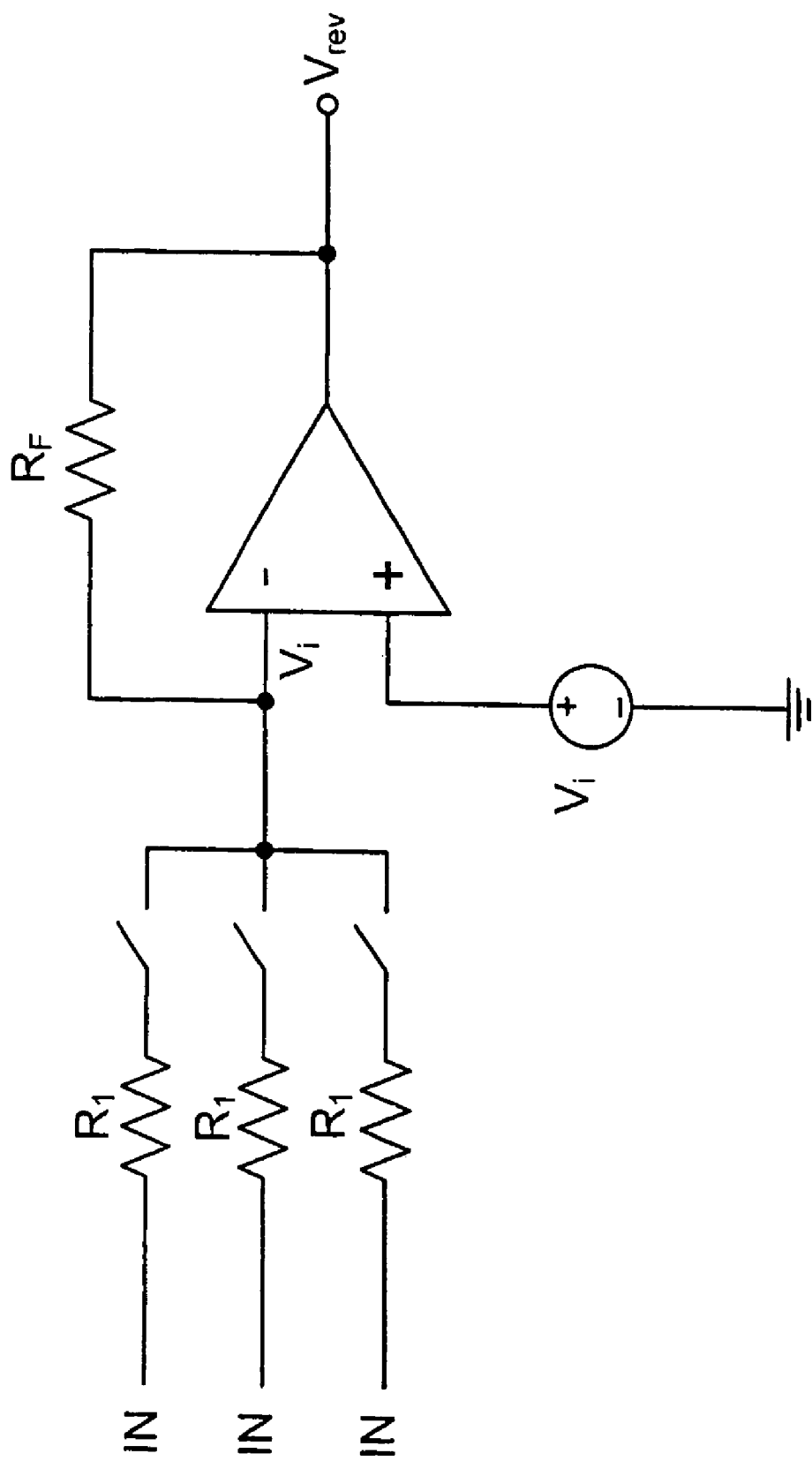
FIG. 13 is an example of a summing node switch.

In addition, while specific switching devices and arrangements are shown, the specific switching devices and arrangements that will be used will depend upon the particular implementation, details of the particular functional and/or sub-functional units and other normal design criteria. Similar or different types of switching devices may be used on the same semiconductor to replace the non-operable functional and/or sub-functional units. When the connecting wires between sub-functional units carry analog signals, analog switching is performed which preferably employs current-switching devices, generally for analog output signals and summing node switching for analog input signals. Such switching devices have several advantages over voltage-based switching devices such as reduced attenuation, lower impedance and lower distortion. FIG. 13 shows an example of summing node switching. Summing node switching provides for input analog signals, which may be greater than Vdd or negative. In contrast to voltage mode'switching, voltage signals greater than Vdd or negative may cause the switching transistor to become forward biased. A further explanation of active summing devices may be found in commonly assigned application Ser. No. 09/629,092, filed: Jul. 31, 2000 and entitled "Active Resistance Summer For A Transformer Hybrid", the contents of which are incorporated herein by reference.

Digital switching devices may be employed for connecting wires carrying digital signals. These type of switches include for example, standard logic devices, gates, muxes, transistors and the like.

Figure 3B:
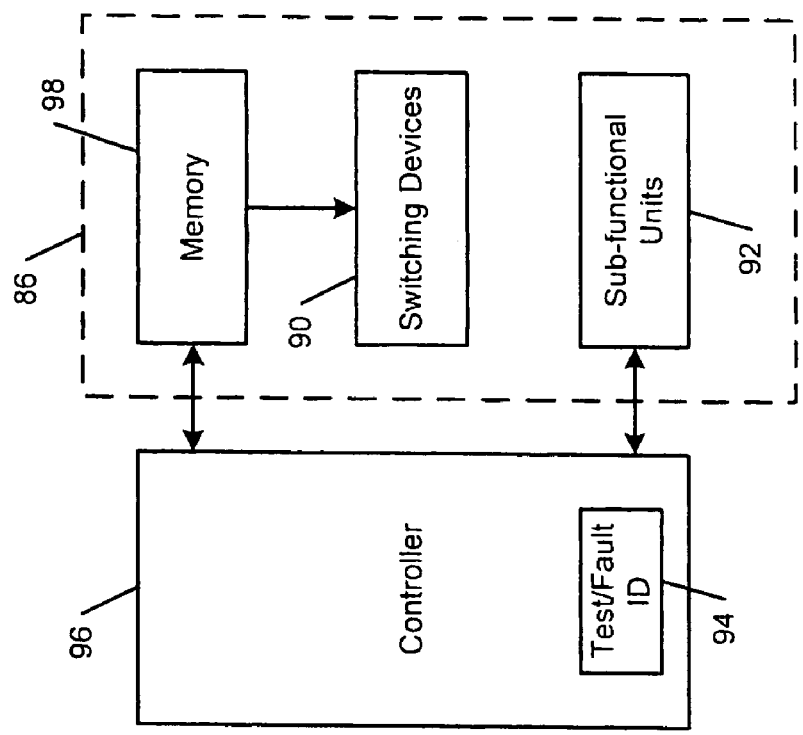
FIG. 3B is a functional block diagram of an off-chip controller that commands the switching devices and optionally includes a test/fault detection circuit.
Figure 3A:
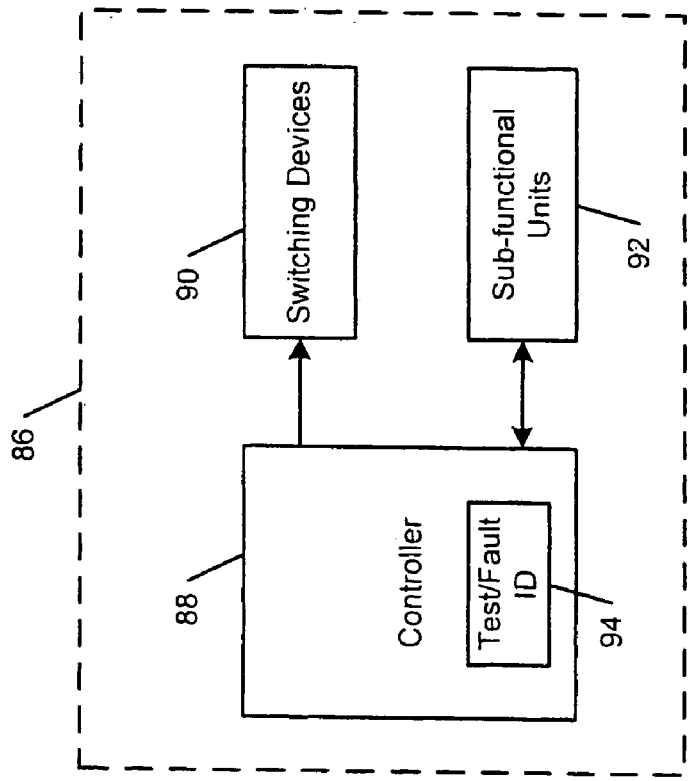
FIG. 3A is a functional block diagram of an on-chip controller that commands the switching devices and optionally includes a test/fault detection circuit.

Referring now to FIG. 3A, a semiconductor 86 of each of the embodiments can include a controller 88 that is located on-chip and that communicates with the switching devices 90 and the sub-functional units 92. A test or fault identification circuit 94 identifies non-operable sub-functional units 92 and generates configuration data. The controller 88 commands the switching devices 90 to replace the non-operable sub-functional units 92 as previously described. The controller 88 may execute a built-in self test mode after assembly, during power up, periodically during operation, and/or manually.

Referring now to FIG. 3B, a semiconductor 86 of each of the embodiments can include a controller 96 that is located off-chip and that is removably connected to on-chip memory 98, such as non-volatile memory. The memory 98 stores configuration data defining switch positions for the switching devices 90. The controller 96 is connected to the sub-functional units 92 and detects and/or tests for failures. The controller 96 uses the test results to define the configuration data that is then stored in the memory 98. When powered on, the configuration-data is used to configure the sub-functional units 92. As can be appreciated, there are a variety of other ways to implement the switching devices. For example, fuses, such as laser fuses or anti-fuses, can be used to make and/or break connections to replace functional units and/or sub-functional units. External pins or dip switches can also be used.

Figure 4:
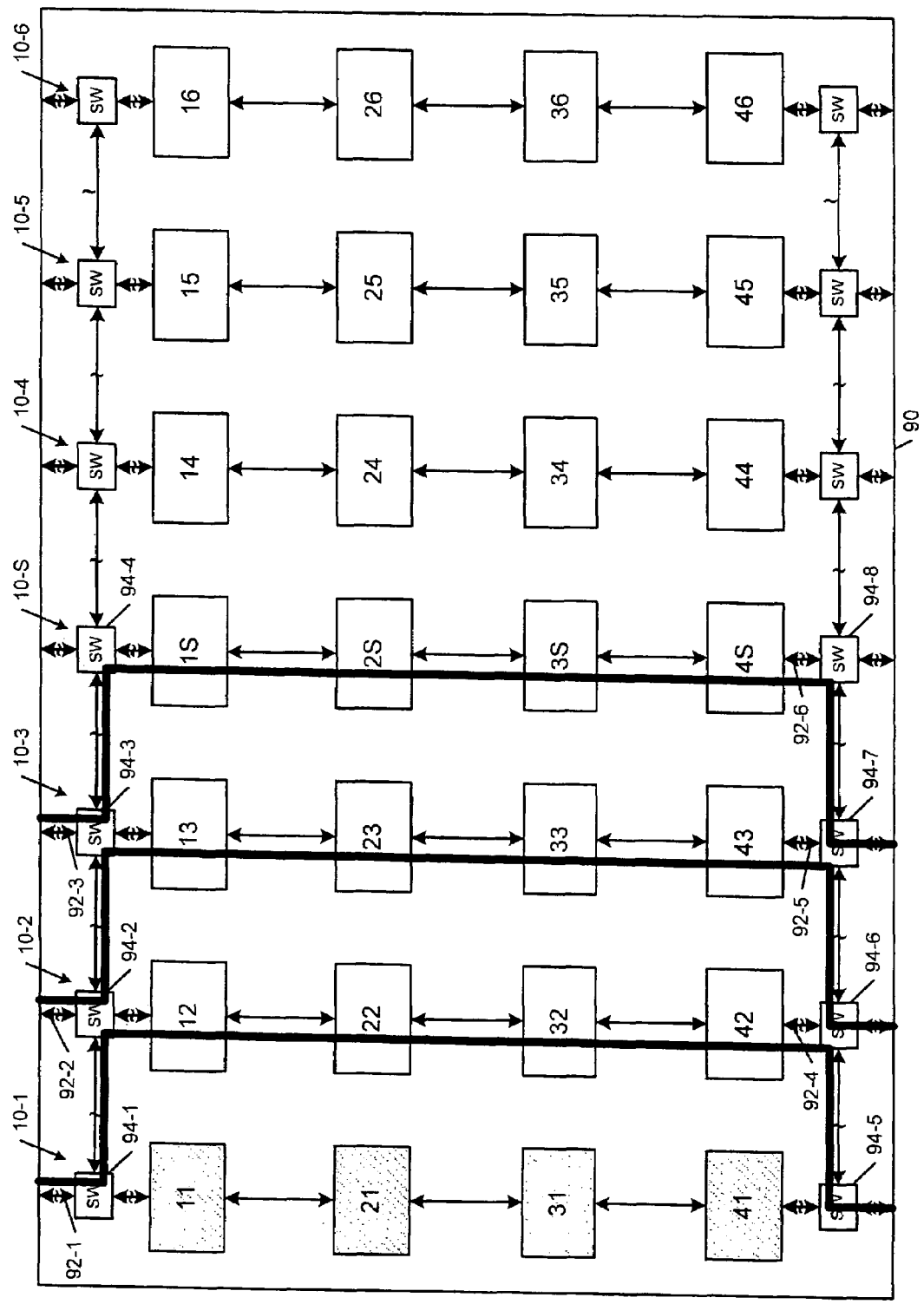
FIG. 4 is a functional block diagram of a first exemplary self-reparable semiconductor including a spare functional unit that replaces a non-operable functional unit according-to the present invention.

Referring now to FIG. 4, a spare functional unit 10-S is fabricated on a semiconductor 90 in addition to the functional units 10-1, 10-2, . . . , and 10-6. In addition, switching devices 94 are located at inputs and outputs of some or all of the sub-functional units. In the exemplary embodiment illustrated in FIG. 3, the spare functional unit 10-S is located between the functional units 10. As can be appreciated, however, the spare functional unit 10-S can be located in any position on the semiconductor 100. For example, the spare functional unit 10-S can be located to the left or right of any of the functional units 10.

The switching devices 94 and the spare functional unit 10-S allow the semiconductor 90 to replace non-operable functional units 10-1, 10-2, 10-3, 10-4, 10-5 and/or 10-6. In the example in FIG. 4, the spare functional unit 10-S allows any number of sub-functional units in one functional unit to fail. By allowing the replacement of non-operable functional units, the yield of the semiconductor 90 is significantly improved. If one or any combination of the sub-functional units 11, 21, 31, and/or 41 in the functional unit 10-1 fail (as shown by cross-hatched shading), the switches 94 are reconfigured to replace the non-operable sub-functional units 11, 21, 31, and 41 with the sub-functional units in the spare functional unit 10-S.

For example, if the sub-functional unit 11 is non-operable, the inputs 92-1, 92-2, and 92-3 to the sub-functional units 11, 12, and 13 are shifted one functional unit to the right by switches 94-1, 94-2, 94-3, and 94-4. The outputs 92-4, 92-5, and 92-6 of the'sub-functional units 42, 43, and 4S are shifted one functional unit to the left by switches 94-5, 94-6, 94-7, and 94-8.

After reconfiguration, the first functional unit 10-1 includes sub-functional units 12, 22, 32, and 42. The second functional unit 10-2 includes sub-functional units 13, 23, 33, and 43. The third functional unit 10-3 includes sub-functional units 1S, 2S, 3S, and 4S. The fourth functional unit 10-4 includes sub-functional units 14, 24, 34, and 44. The fifth functional unit 10-5 includes sub-functional units 15, 25, 35, and 45. The sixth functional unit 10-6 includes sub-functional units 16, 26, 36, and 46. This exemplary embodiment allows replacement on a functional unit basis only.

Figure 5:
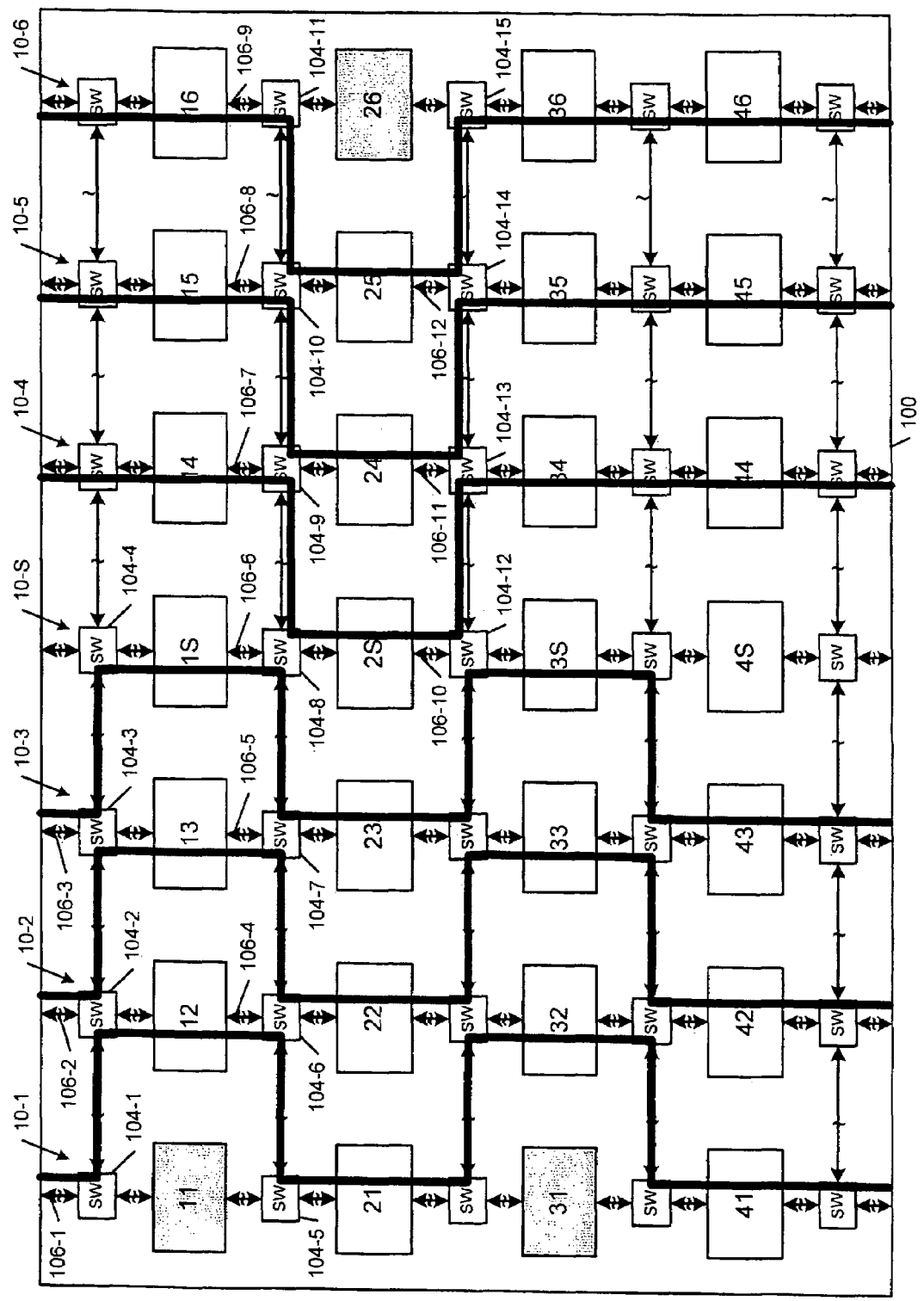
FIG. 5 is a functional block diagram of a second exemplary self-reparable semiconductor with a spare functional unit that replaces one or more non-operable sub-functional units according to the present invention.

Referring now to FIG. 5, a spare functional unit 10-S is fabricated on a semiconductor 100 in addition to the functional units 10-1, 10-2, . . . , and 10-6. In addition, switching devices 104 are located at inputs and outputs of the sub-functional units. In the exemplary embodiment illustrated in FIG. 5, the spare functional unit 10-S is located between the functional units 10. The switching devices 104 and the spare functional unit 10-S allow the semiconductor 100 to replace non-operable sub-functional units in the functional units 10-1, 10-2, 10-3, 10-4, 10-5 and/or 10-6. In the example in FIG. 5, the spare functional unit 10-S allows one sub-functional unit in each row to fail. By allowing the replacement of non-operable sub-functional units, the yield of the semiconductor 100 is significantly improved. This exemplary embodiment allows replacement on a functional unit or a sub-functional unit basis and/or replacement-of multiple sub-functional units in different functional units. If the sub-functional units 11, 31 and 26 fail (as shown in shading), the switches 104 are reconfigured to replace the non-operable sub-functional units 11, 31 and 26 with sub-functional units 15, 35 and 25, respectively, in the spare functional unit 10-S.

The non-operable sub-functional unit 11 is replaced as follows: The inputs 106-1,106-2, and 106-3 to the sub-functional units 11, 12, and-13 are shifted one functional unit to the right by switches 104-1, 104-2, 104-3, and 104-4. The outputs 106-4, 106-5, and 106-6 of the sub-functional units 12, 13, and 1S are shifted one functional unit to the left by switches 104-5, 104-6, 104-7, and 104-8. The non-operable sub-functional unit 13 is replaced in a similar manner.

The non-operable sub-functional unit 26 is replaced as follows: The outputs 106-7, 106-8, and 106-9 of the sub-functional units 14, 15, and 16 are shifted one functional unit to the left by switches 104-8, 104-9, 104-10, and 104-11. The outputs 106-10, 106-11, and 106-12 of the sub-functional units 2S, 24, and 25 are shifted one functional unit to the right by switches 104-12, 104-13, 104-14, and 104-15.

After reconfiguration, the first functional unit 10-1 includes sub-functional units 12, 21, 32, and 41. The second functional unit 10-2 includes sub-functional units 13, 22, 33, and 42. The third functional unit 10-3 includes sub-functional units 1S, 23, 3S, and 43. The fourth functional unit 10-4 includes sub-functional units 14, 2S, 34, and 44. The fifth functional unit 10-5 includes sub-functional units 15, 24, 35, and 45. The sixth functional unit 10-6 includes sub-functional units 16, 25, 36, and 46.

Figure 6:
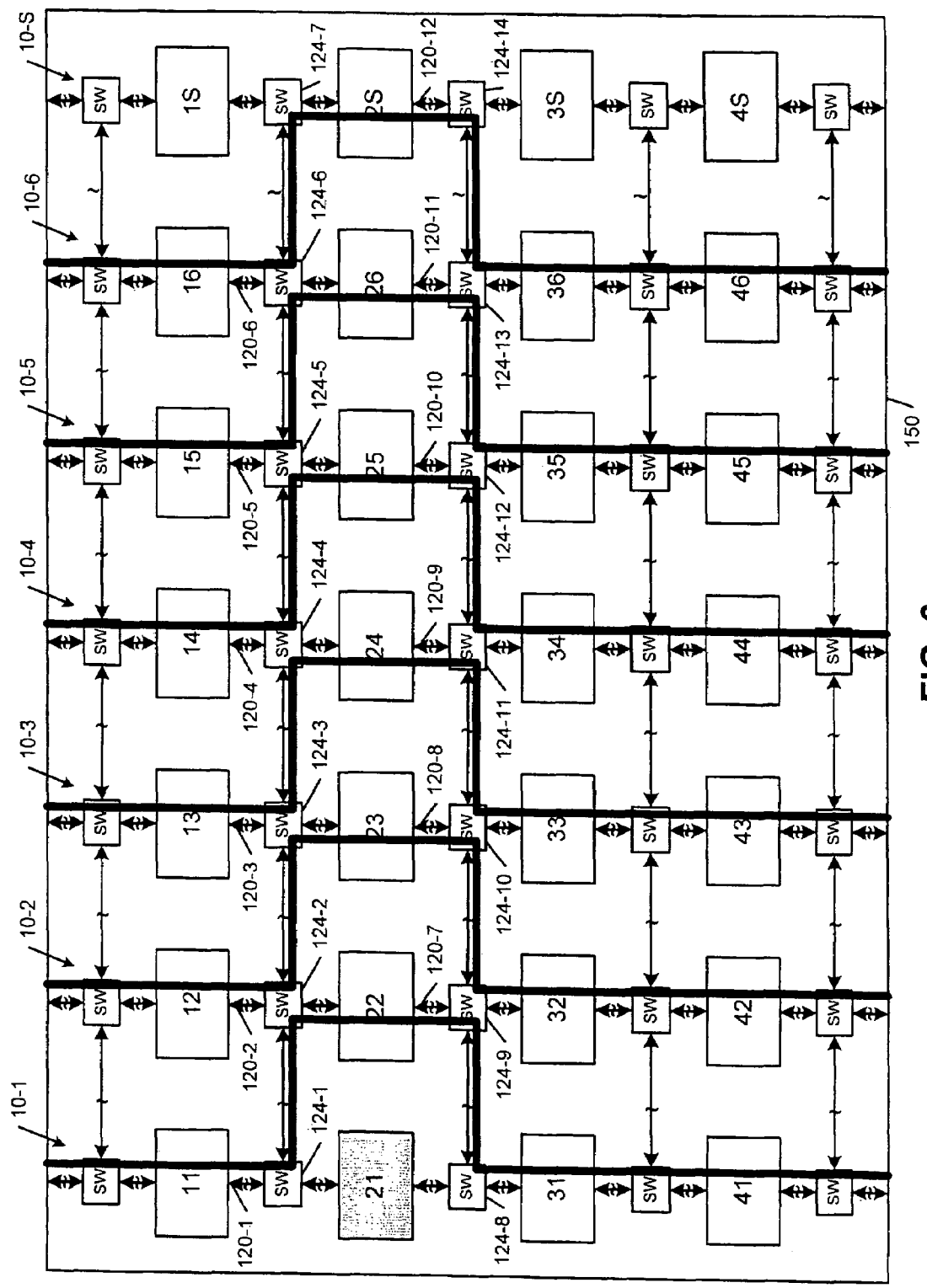
FIG. 6 is a functional block diagram of a third exemplary self-reparable semiconductor including a spare functional unit located at one end according to the present invention.

Referring now to FIG. 6, a semiconductor 150 includes the spare sub-functional unit 10-S that is located at one end. If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-7. The outputs 120-7, 120-8, . . . , and 120-12 of the sub-functional units 22, 23, . . . and 2S are shifted one functional unit to the left by switches 124-8, 124-9, . . . , and 124-14.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 7:
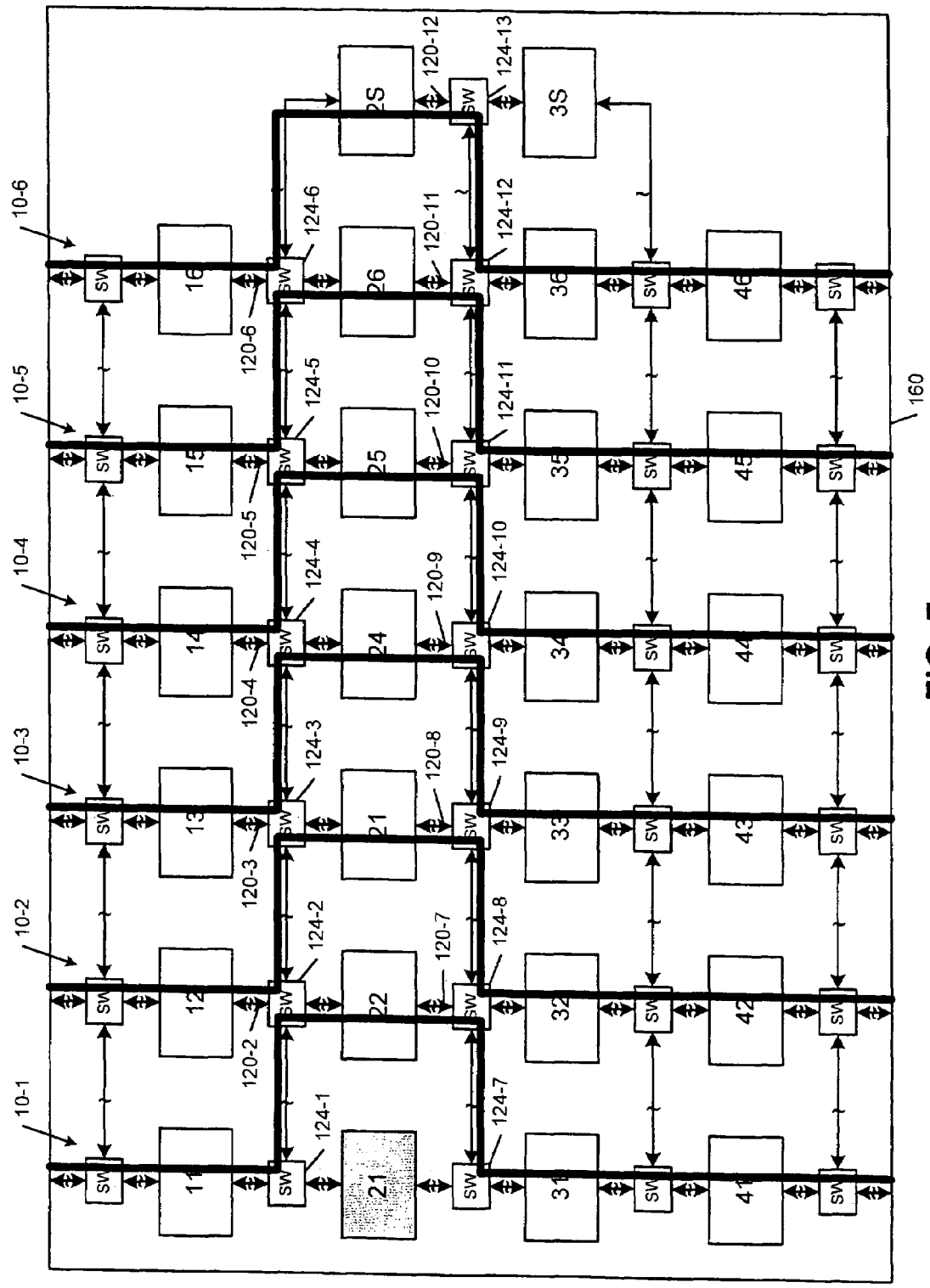
FIG. 7 is a functional block diagram of a fourth exemplary self-reparable semiconductor including a partial spare functional unit according to the present invention.

Referring now to FIG. 7, a semiconductor 160 includes a partial spare sub-functional unit 10-PS that is located at one end. The partial spare sub-functional unit 10-PS includes one or more sub-functional units (for some but not all of the sub-functional units). For example, the partial sub-functional unit 10-PS includes sub-functional units 2S and 3S but not 1S or 4S. The partial sub-functional units that are provided may be associated with sub-functional units that are more likely to have a lower yield. By not fabricating the other sub-functional units and switches, the cost of the semiconductor 160 may be reduced.

If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-6. The outputs 120-7, 120-8, . . . , and 120-12 of the sub-functional units 22, 23, . . . and 2S are shifted one functional unit to the left by switches 124-8, 124-9, . . . , and 124-13.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 8:
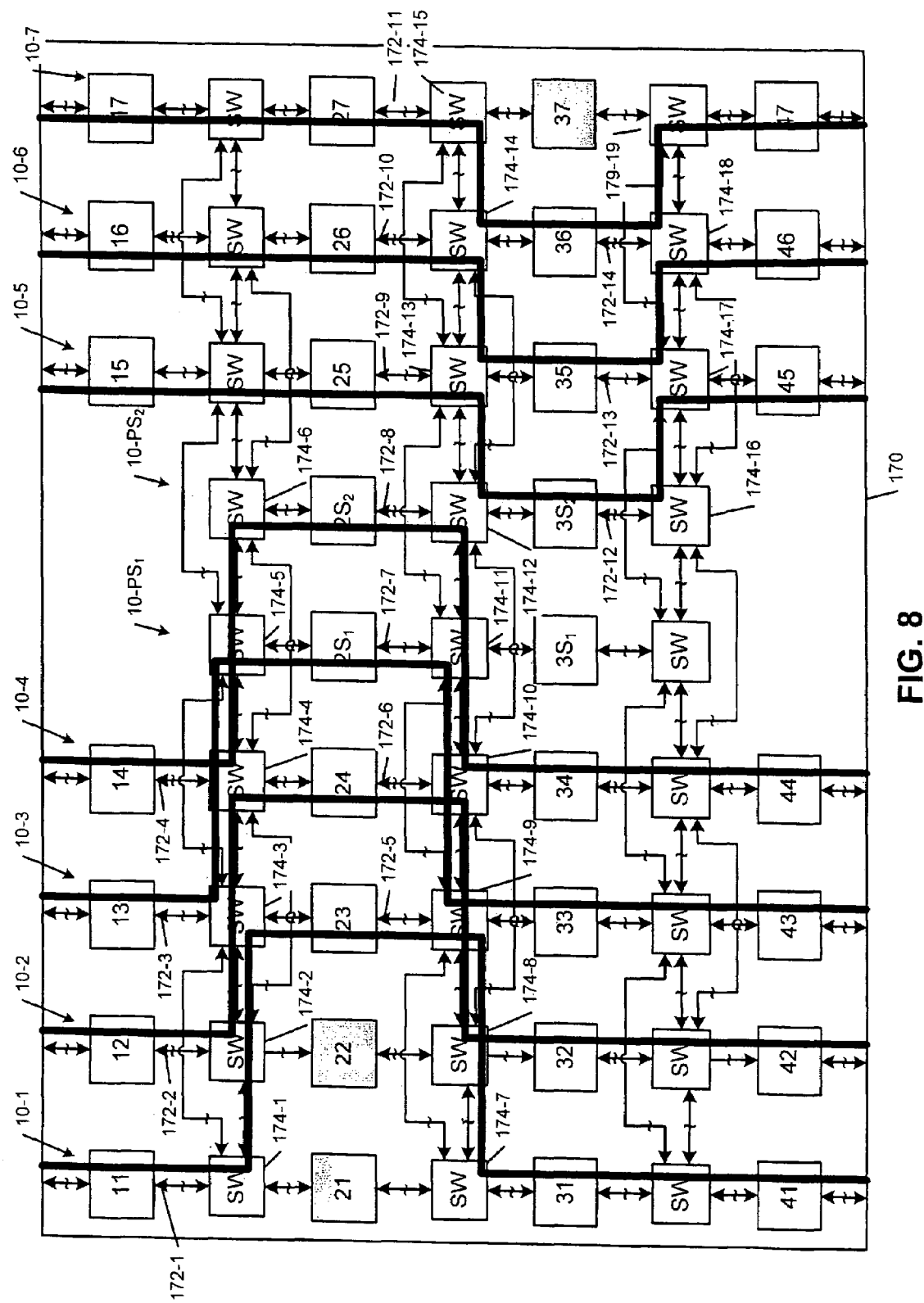
FIG. 8 is a functional block diagram of a fifth exemplary self-reparable semiconductor including two partial spare functional units located in the middle according to the present invention.

Referring now to FIG. 8, additional full and/or partial spare functional units can be provided. For example, a semiconductor 170 in FIG. 8 includes two partial spare sub-functional units 10-PS$_1$ and 10-PS$_2$. The full and/or partial spare sub-functional units 10-PS$_1$ and 10-PS$_2$ can be located adjacent to each other (as shown) or in non-adjacent positions. If the full or partial sub-functional units are located adjacent to each other, switches 172 switch inputs and/or outputs between two adjacent switches. For example, the switch 174-1 can switch inputs and/or outputs from sub-functional unit 11 to either sub-functional unit 22 or 23.

If the sub-functional units 21 and 22 fail (as shown in-shading), the inputs 172-1, 172-2, 172-3, and 172-4 to the sub-functional units 21, 22, 23 and 24 are shifted two functional units to the right by switches 174-1, 174-2, . . . , and 174-6. The outputs 172-5, 172-6, . . . , and 172-8 of the sub-functional units 23, 24, 2S$_1$ and 2S$_2$ are shifted two functional units to the left by switches 174-7, 174-8, . . . , and 174-12.

If the sub-functional unit 37 fails, the inputs 172-9, 172-10, and 172-11 to the sub-functional units 35, 36, and 37 are shifted one functional unit to the left by switches 174-12, 174-13, 174-14, and 174-15. The outputs 172-12, 172-13, and 172-14 of the sub-functional units 3S$_2$, 35, and 36 are shifted one functional unit to the right by switches 174-16, 174-17, 174-18, and 174-19.

After reconfiguration, the first functional unit 10-1 includes sub-functional units 11, 23, 31, and 41. The second functional unit 10-2 includes sub-functional units 12, 24, 32, and 42. The third functional unit 10-3 includes sub-functional units 13, 2S$_1$, 33, and 43. The fourth functional unit 10-4 includes sub-functional units 14, 2S$_2$, 34, and 44. The fifth functional unit 10-5 includes sub-functional units 15, 25, 3S$_2$, and 45. The sixth functional unit 10-6 includes sub-functional units 16, 26, 35, and 46. The seventh functional unit 10-7 includes sub-functional units 17, 27, 36, and 47.

Figure 9:
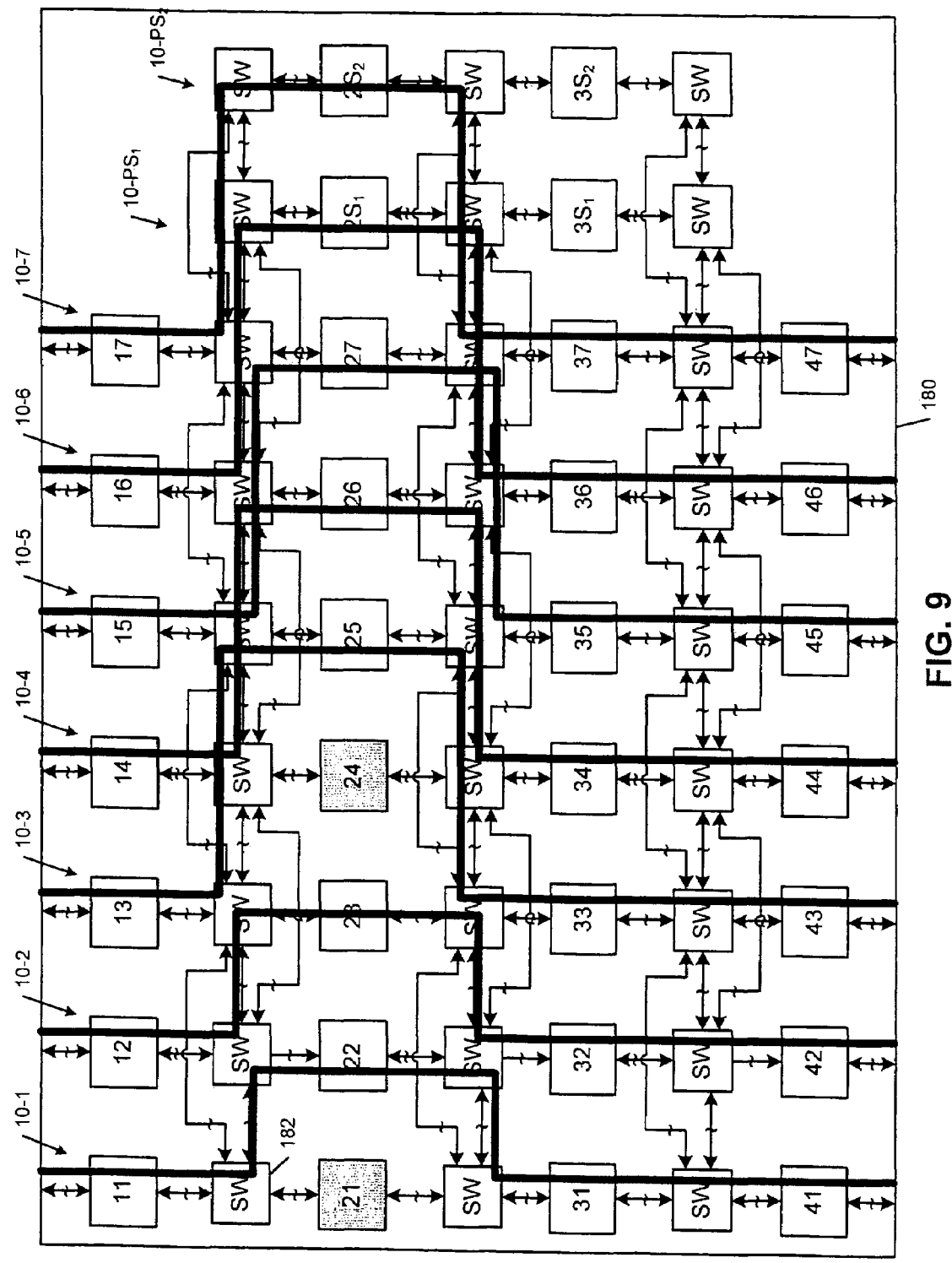
FIG. 9 is a functional block diagram of a sixth exemplary self-reparable semiconductor including two partial spare functional units located at one end according to the present invention.

The semiconductor can also include two or more full and/or partial functional units that are located at one end or in any other position. In FIG. 9, two partial spare functional units 10-PS$_1$ and 10-PS$_2$ are located at one end of a semiconductor 180. If sub-functional units 21 and 24 fail (as shown in shading), the switching devices 182 replace them with sub-functional units 2S$_1$ and 2S$_2$ in the spare functional units 10-PS$_1$ and 10PS$_2$.

After reconfiguration, the first functional unit 10-1 includes sub-functional units 11, 22, 31, and 41. The second functional unit 10-2 includes sub-functional units 1-2, 23, 32, and 42. The third functional unit 10-3 includes sub-functional units 13, 25, 33, and 43. The fourth functional unit 10-4 includes sub-functional units 14, 26, 34, and 44. The fifth functional unit 10-5 includes sub-functional units 15, 27, 35, and 45. The sixth functional unit 10-6 includes sub-functional units 16, 2S$_1$, 36, and 46. The seventh functional unit 10-7 includes sub-functional units 17, 2S$_2$, 37, and 47.

Figure 10:
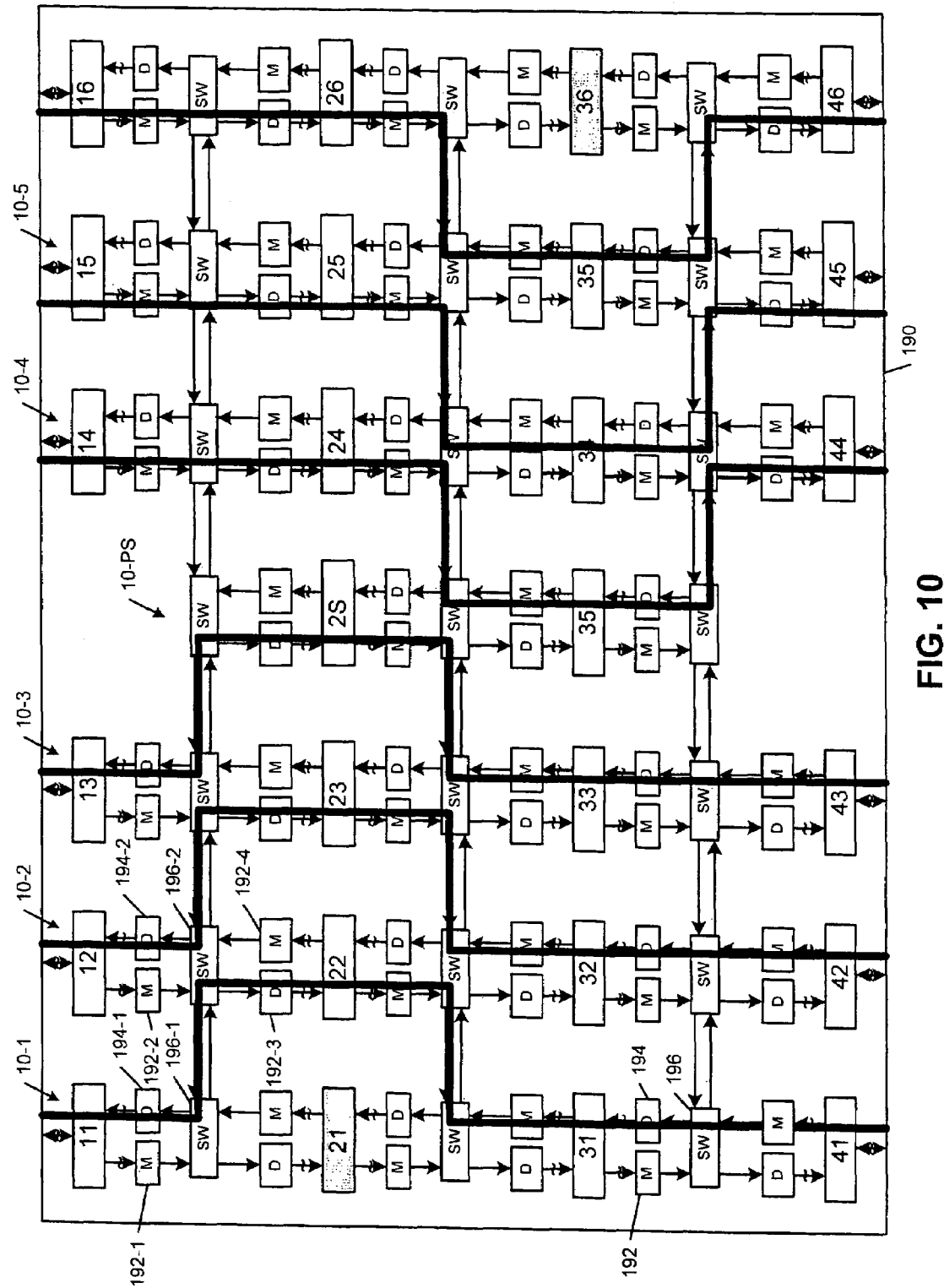
FIG. 10 is a functional block diagram of a seventh exemplary self-reparable semiconductor including a partial spare functional unit and multiplexed switching devices according to the present invention.

Referring now to FIG. 10, to reduce the complexity of the switching devices, the semiconductor 190 includes multiplexed switching devices that include multiplexers (M) 192 that receive p input signals and that output 1 to q output signals, where q is less than p. For example, p input signals can be multiplexed into one output signal.

Alternately, the p input signals can be multiplexed into two or more output signals. For example, eight input signals can be multiplexed into three output signals. In this example, one input signal is not multiplexed, for example a high speed signal such as-data signals in the Gigabit physical layer device. Two medium speed signals can be multiplexed into one output signal. The remaining five input signals, which are preferably "slow" signals such as control signals in the Gigabit PHY, can be multiplexed into one output signal.

Figure 11:
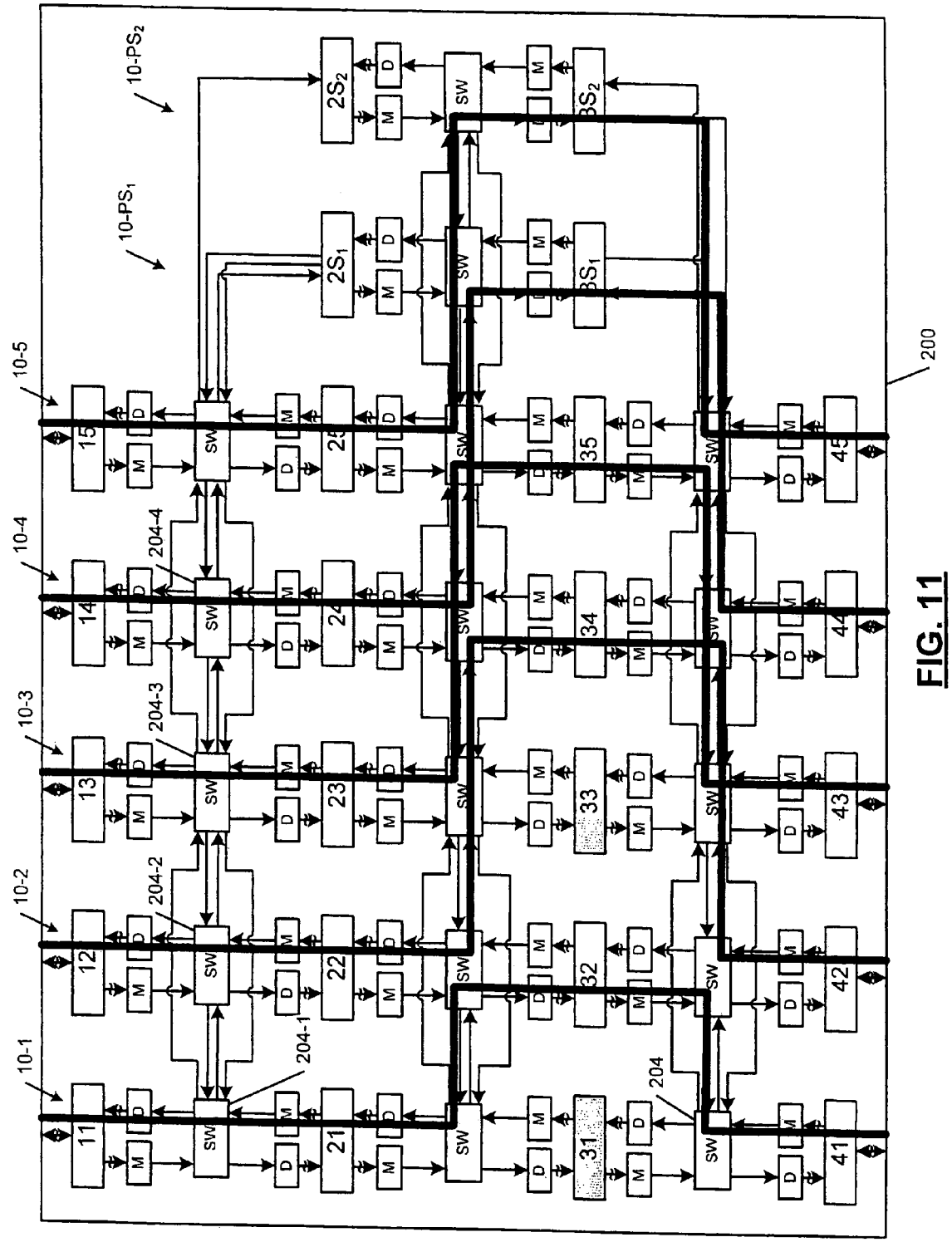
FIG. 11 is a functional block diagram of an eighth exemplary self-reparable semiconductor including multiple functional units each with sub-functional units, two partial spare functional units and multiplexed switching devices according to the present invention.

Demultiplexers (D) 194 receive 1 to q input signals and generate p output signals. The number of inputs and outputs that are multiplexed and demultiplexed will depend upon the particular sub-functional units that communicate with the multiplexers 192 and demultiplexers 194. By decreasing the number of connecting wires that need to be switched, the switching devices can be simplified. The exemplary embodiments shown in FIGS. 10 and 11 show multiple inputs that are multiplexed to a single output. Based on the preceding discussion, however, skilled artisans will appreciate that the output of the multiplexer may include one or more outputs that may be multiplexed or not multiplexed.

For example, if the sub-functional unit 21 fails, the switching devices 196-1 and 196-2 connect the multiplexer 192-1 with the demultiplexer 192-3. This establishes a forward path for signals being sent from the sub-functional unit 11 to the sub-functional unit 22 (which replaces non-operable sub-functional unit 21); The demultiplexer 192-3 communicates with the sub-functional unit 22. Likewise, a reverse path can be established if needed. The switching devices 196-1 and 196-2 connect the multiplexer 192-4 to the demultiplexer 194-1, which communicates with the sub-functional unit 11. As can be appreciated, while forward and reverse signal paths are shown, forward and/or reverse paths may be used between the sub-functional units as needed. Some of the multiplexers and demultiplexers can be omitted if both forward and reverse paths are not used between sub-functional units.

After failure and reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 2S, 33, and 43. The fourth functional unit 10-4 includes sub-functional units 14, 24, 3S, and 44. The fifth functional unit 10-5 includes sub-functional units 15, 25, 34, and 45. The sixth functional unit 10-6 includes sub-functional units 16, 26, 35, and 46.

The semiconductor with multiplexed switching devices can include multiple full or partial spare sub-functional units. Referring now to FIG. 11, a semiconductor 200 includes two partial spare sub-functional units 10-PS$_1$ and 10PS$_2$. The multiple full or partial spare sub-functional units need not be located adjacent to each other. Switching devices 204 connect to at least two adjacent switches. For example, the switching device 204-1 communicates with the switching devices 204-2 and 204-3. Likewise, the switching device 204-2 communicates with the switching devices 204-3 and 204-4. The semiconductor 200 is capable of replacing two failures in the same row.

For example, if sub-functional units 31 and 33 fail (as shown in shading), the switches 204 are reconfigured. The first functional unit 10-1 includes sub-functional units 11, 21, 32, and 41. The second functional unit 10-2 includes sub-functional units 12, 22, 34, and 42. The third functional unit 10-3 includes sub-functional units 13, 23, 35, and 43. The fourth functional unit 10-4 includes sub-functional units 14, 24, 3S$_1$, and 44. The fifth functional unit 10-5 includes sub-functional units 15, 25, 3S$_2$, and 45.

Assuming that defects are uniformly and independently distributed on the semiconductor (which may or may not be true), if the yield for a single functional unit is $P_s$, then the yield for a first sub-functional unit is $P_{sub1}=P_s((\text{area of sub-functional unit})/\text{area of functional unit}))$. The yield $P_s$ of the functional unit is equal to the product of the yields for each sub-functional unit.

If p is the yield of the functional units, m is the minimum number of working functional units and n is equal to m plus the number of spare functional units, the yield is defined as follows:

$$\text{yield} = f(p, m, n) = \sum_{x=m}^{n} p^x (1-p)^{n-x} \frac{n!}{x!(n-x)!}$$

For example, a semiconductor with 8 functional units each having a uniform yield of 90% (and spare functional units) would have a yield of 43%. Assume that the functional units have four sub-functional units A, B, C, and D. All of the sub-functional units are swapped out as a group if A, B, C and/or D experience a fault. With one spare functional unit, the yield increases to 77.5%.

If the functional blocks can be swapped out in two groups (A and B) and/or (C and D), the yield is equal to:

$$\text{yield}=f(p_A \times p_B, m, n) \times f(p_C \times p_D, m, n)$$

In this example, the yield increases to 85.6% when the defect density of A+B=defect density of C+D.

If the functional blocks can be swapped out in three groups (A and B), C and/or D, the yield is equal to:

$$\text{yield}=f(p_A \times p_B, m, n) \times f(p_C, m, n) \times f(p_D, m, n)$$

In this example, the yield increases to 88.6% when the defect density of A=B=C=D.

If the functional blocks can be swapped out in four groups A, B, C and/or D, the yield is equal to:

$$\text{yield}=f(p_A, m, n) \times f(p_B, m, n) \times f(p_C, m, n) \times f(p_D, m, n)$$

In this example, the yield increases to 91.7% when the defect density of A=B=C=D.

As can be appreciated, providing one spare functional unit increase yield dramatically. Splitting the functional units into two or more sub-functional units that can be individually swapped out further increases yield. At some point, the tradeoff between improved yield is offset by increased design complexity.

Figure 12:
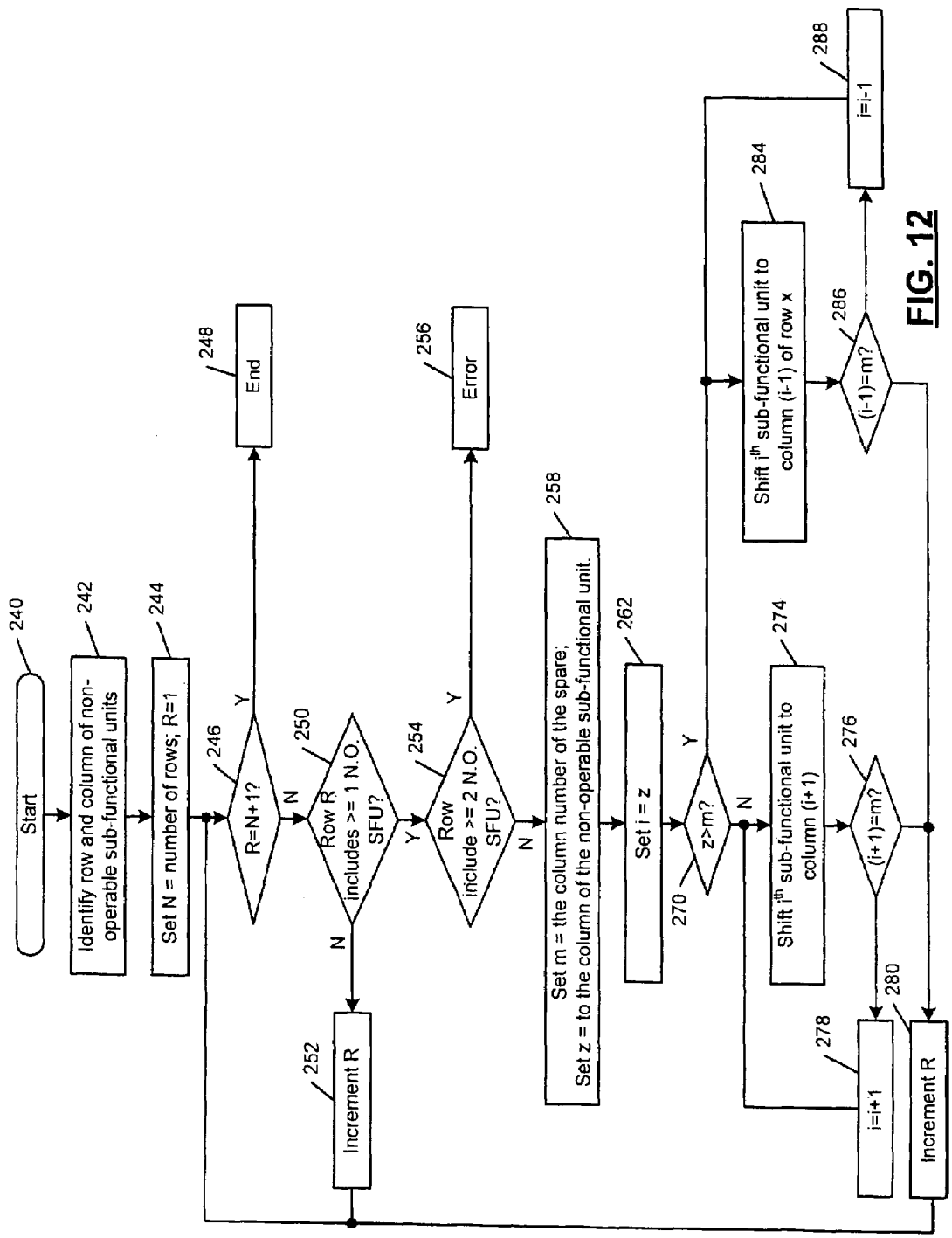
FIG. 12 is a flowchart illustrating steps for replacing non-operable sub-functional units with sub-functional units in a single spare functional unit.

Referring now to FIG. 12, steps of a method for replacing non-operable sub-functional units using a single full or partial functional unit is shown. Control begins with step 240. In step 242, control identifies rows and columns of non-operable sub-functional units. In step 244, control sets N equal to the number of rows in the functional units and sets R equal to one. In step 246, control determines whether R is equal to N+1. If true, control ends in step 248. If false, control continues with step 250 where control determines if row R has greater than or equal to one non-operable (N.O.) sub-functional unit (SFU). If false, control increments R in step 252 and control returns to step 246. If true, control continues with step 254 where control determines if row R includes greater than or equal to two non-operable (N.O.) sub-functional units (SFU). Since only one spare full or partial sub-functional unit is provided, an error is signaled in step 256 if two or more non-operable sub-functional units are in the same row.

In step 258, control sets m equal to the column number of the full or partial spare functional unit and z equal to the column of the non-operable sub-functional unit. In step 262, control sets i=z. In step 270, control determines whether z>m. If false, control continues with step 274 and shifts the i$^{th}$ sub-functional unit to column (i+1) using the switching devices. In step 276, control determines whether (i+1)=m. If not, control increments i in step 278 and continues with step 274. Otherwise, control increments R in step 280 and control continues with step 254.

If z is greater than m in step 270, control continues with step 284 and shifts the i$^{th}$ sub-functional unit to column (i−1) using the switching devices. In step 286, control determines whether (i−1) is equal to m. If not, control decrements i in step 288 and continues with step 284. Otherwise, control continues with step 280.

As can be appreciated by skilled artisans, similar algorithms for replacing non-operable functional units and/or sub-functional units can be performed for semiconductors including two or more full or partial spare functional units and/or sub-functional units. In addition, while specific switching arrangements are shown, the specific switching devices that will be used will depend upon the particular implementation, details of the particular functional and/or sub-functional units and other normal design criteria. Various different types of switching devices may also be used on the same semiconductor.

Figure 14:
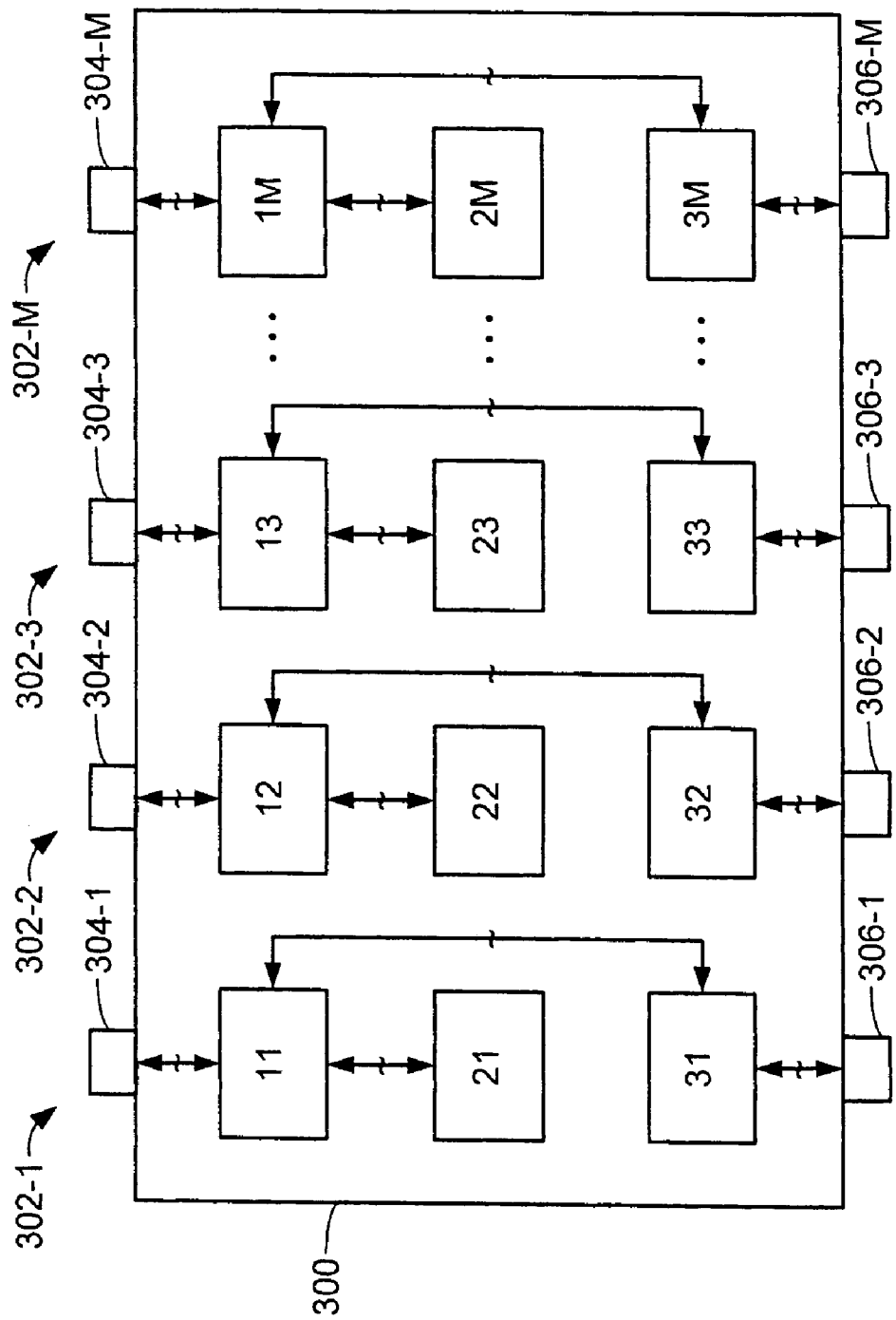
FIG. 14 is a functional block diagram of a semiconductor including functional units with first and second sub-functional units that communicate and first and third sub-functional units that communicate according to the prior art.

Referring now to FIG. 14, a semiconductor 300 includes M functional units 302-1, 302-2, . . . , and 302-M (collectively 302). Each of the M functional units 302 includes first, second, and third sub-functional units 1X, 2X, and 3X, respectively, where X is a number between 1 and M. First sub-functional units 11, 12, 13, . . . , and 1M communicate with second sub-functional units 21, 22, 23, . . . , and 2M, respectively. The first sub-functional units 1X also communicate with third sub-functional units 31, 32,33, . . . , and 3M, respectively. For example, the first sub-functional units 1X may include external analog and/or digital inputs/outputs (I/Os) and the third sub-functional units 3X may include external analog and/or digital I/Os. In this example, the second sub-functional units 2X do not communicate with the third sub-functional units 3X. However, skilled artisans will appreciate that the second sub-functional units 2X may communicate with the third sub-functional units 3X. Additional sub-functional units may be added and connected as needed.

The first sub-functional units 1X communicate with pads 304 of the semiconductor 300, and the third sub-functional units. 3X communicate with pads 306 of the semiconductor 300. While the exemplary embodiment illustrated in FIG. 14 includes first, second, and third sub-functional units 1X, 2X, and 3X, respectively, in each of the M functional units 302, those skilled in the art can appreciate that the functional units 302 of the semiconductor 300 may include any number of sub-functional units that communicate in different combinations.

Problems arise when one of the sub-functional units is inoperable. For example, if a third sub-functional unit 3X in a given functional Until 302 is inoperable, a signal path between a first sub-functional unit 1X and a second sub-functional 2X unit may remain intact. However, the signal path between the first and third sub-functional units 1X and 3X, respectively, is unusable. Therefore, the entire functional unit 302 is inoperable. For example, a port of a multi-port switch is defective. It is desirable to switch out sub-functional and/or entire functional units 302 and replace them with spare sub-functional and/or functional units 302 when one or more sub-functional units become inoperable to increase the yield of the semiconductor 300.

Figure 15:
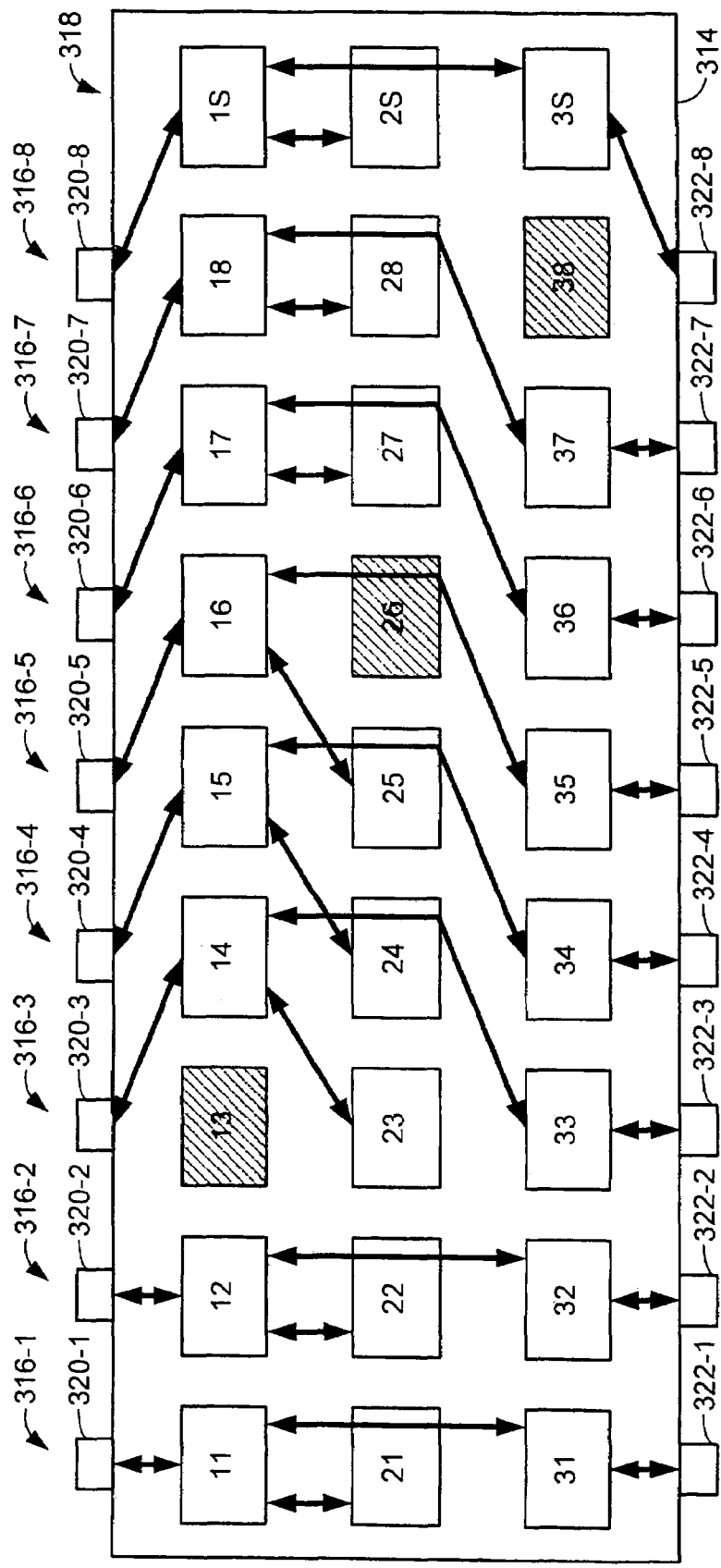
FIG. 15 is a functional block diagram of a first exemplary eight-port self-reparable semiconductor including a spare functional unit that replaces one or more inoperable sub-functional units according to the present invention.

Referring now to FIG. 15, an 8-port semiconductor 314 includes nine functional units 316 and 318. The nine functional units 316 and 318 include eight functional units 316 that communicate with respective input and pads 320 and 322, respectively, of the semiconductor 314 and a spare functional unit 318. While the spare functional unit 318 is shown at the far right of the semiconductor 134 in this exemplary implementation, the spare functional unit 318 may be located at the far left of the semiconductor 314 or between any two functional units 316.

A physical port slice 316 refers to a grouping of sub-functional units 1X, 2X, and 3X in a specific functional unit 316 that are physically positioned as one port. Typically (but not necessarily), the sub-functional units in a physical slice are vertically stacked. For example, the first physical port slice 316-1 in FIG. 15 includes sub-functional units 11, 21, and 31.

The semiconductor 314 includes a spare functional unit 318 with spare sub-functional units IS, 2S, and 3S. Switching devices in the semiconductor 314 (not shown in FIG. 15 for simplicity) may route signals from pads 320 of physical port slices 316 through sub-functional units of different physical port slices 316 when one or more sub-functional units 1X, 2X, and/or 3X are inoperable (shown with cross-hatching in FIG. 15). In the semiconductor 314 illustrated in FIG. 15, each row of the semiconductor 314 may include one inoperable sub-functional unit while retaining eight functioning logical port slices.

A logical port slice refers to a grouping of sub-functional units that is used to route a signal from an input pad 320 of a physical port slice 316 to a respective output pad 322 of the same physical port slice 316. For example, sub-functional units 13, 26, and 38 are inoperable in FIG. 15. Therefore, the second logical port slice in FIG. 15 includes sub-functional units 12, 22, and 32. However, since sub-functional unit 13 is inoperable, the switching devices route the signal from the input pad 320-3 of the third physical port slice 316-3 to first sub-functional unit 14 of the fourth physical port slice 316-4. Therefore, the third logical port slice includes sub-functional units 14, 23, and 33.

Signals from pads 320-1 and 320-2 of physical port slices 316-1 and 316-2 are routed to first sub-functional units 11 and 12, respectively, of the same physical port slice 316-1 and 316-2. Beginning with the physical port slice 316-3 (that includes inoperable sub-functional unit 13), signals from the pads 320-3 to 320-8 are routed one functional unit to the right to adjacent physical port slices 316-4 to 316-8 and 318. Although sub-functional unit 13 is inoperable, sub-functional unit 23 remains operable. Therefore, switching devices route an output signal from sub-functional unit 14 to sub-functional unit 23. In an exemplary embodiment, signals between first sub-functional units 1X and respective third sub-functional units 3X are routed through second sub-functional units 2X that are located below operable first sub-functional units 1X. For example, a signal from sub-functional unit 14 to sub-functional unit 33 is routed through sub-functional unit 24.

The routing through sub-functional unit 26 can be wiring with no active circuit in sub-functional unit 26 connecting sub-functional unit 16 to sub-functional unit 35. Even though sub-functional unit 26 is inoperable, a signal from sub-functional unit 16 to sub-functional unit 35 is routed through sub-functional unit 26. This is accomplished by automatically passing signals from first sub-functional units 1X intended for third sub-functional units 3X through second sub-functional units 2X of the same physical port slice 316 during fabrication. Signals from pads 320-3 to 320-8 that are in line with or to the right of the third physical port slice 316-3 are shifted one functional unit to the right. Signals between first and second sub-functional units 14 and 23, 15 and 24, and 16 and 25 in the fourth, fifth, and sixth physical port slices 316-4 to 316-6, respectively, are shifted one functional unit to the left to avoid inoperable sub-functional unit 26. Signals between first and third sub-functional units 14 and 33, 15 and 34, 16 and 35, 17 and 36, and 18 and 37 in the fourth through eighth physical port slices 316-4 to 316-8, respectively, are shifted one functional unit to the left. The signal from spare sub-functional unit 3S to the eight output pad 322-8 is shifted one functional unit to the left.

The resulting logical port slices in FIG. 15 include sub-functional units 11, 21, and 31; 12, 22, and 32; 14, 23, and 33; 15, 24, and 34; 16, 25, and 35; 17, 27, and 36; 18, 28, and 37; and 1S, 2S, and 3S.

Figure 16:
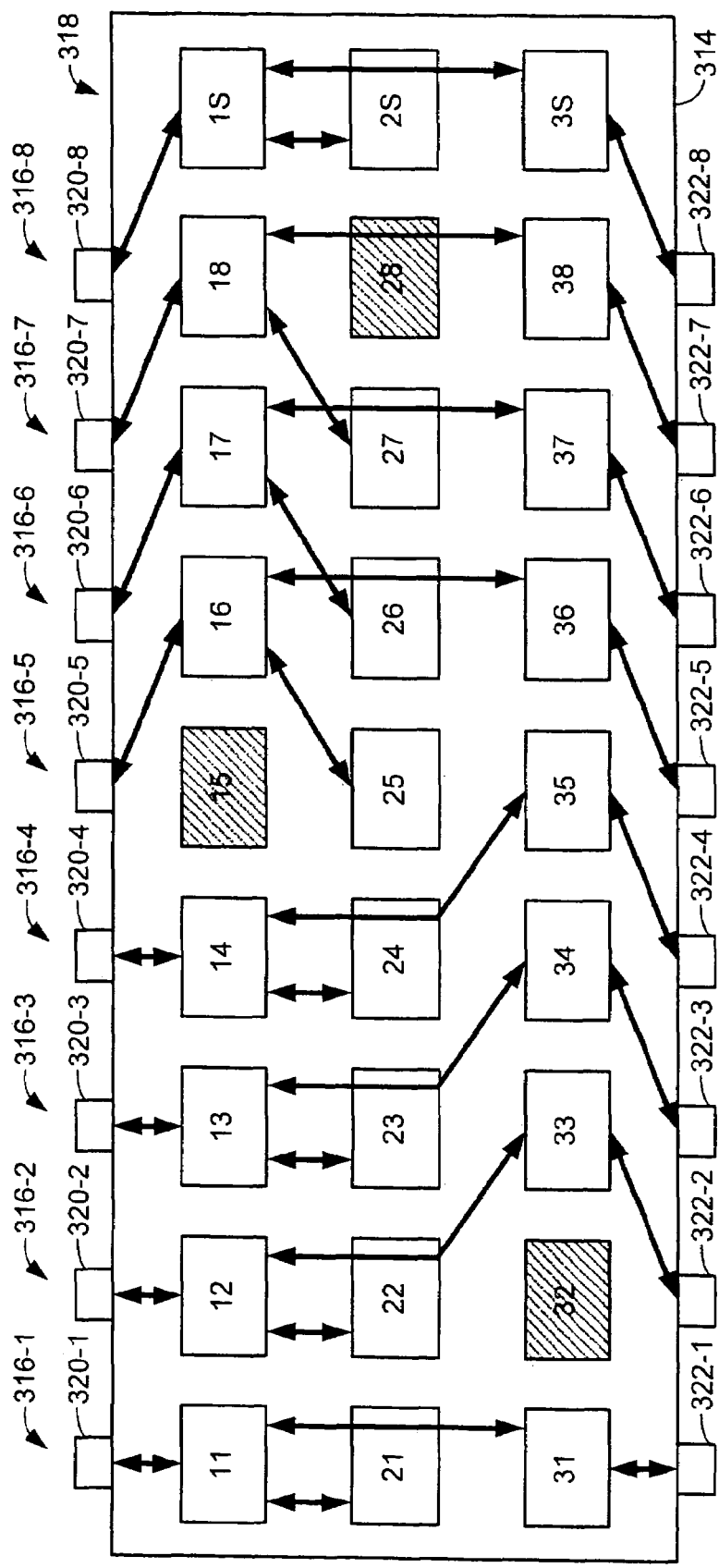
FIG. 16 is a functional block diagram of a second exemplary eight-port self-reparable semiconductor including a spare functional unit that replaces one or more inoperable sub-functional units.

Referring now to FIG. 16, sub-functional units 15, 28, and 32 are inoperable. Signals between pads and first sub-functional units 320-5 and 16, 320-6 and 17,320-7 and 18, and 316-8-and 1S of the fifth through the eighth physical port slices 316-5 to 316-8 are shifted one functional unit to the right. Signals between first and second sub-functional units 16 and 25, 17 and 26, and 18 and 27 from the sixth through eighth physical port slices 316-6 to 316-8 are shifted one functional unit to the left. Signals between first and third sub-functional units 12 and 33, 13 and 34, and 14 and 35 from the second through the fourth physical port slices 316-2 to 316-4 are-shifted one functional unit to the right. Signals from third sub-functional units to pads 33 to 3S and 322-2 to 322-8, respectively, of the third through the eighth physical port slices 316-3 to 316-8 as well as the spare functional unit 318 are shifted one functional unit to the left.

The resulting logical port slices in FIG. 16 include sub-functional units 11, 21, and 31; 12, 22, and 33; 13, 23, and 34; 14, 24, and 35; 16, 25, and 36; 17, 26, and 37; 18, 27, and 38; and 1S, 2S, and 3S.

Figure 17:
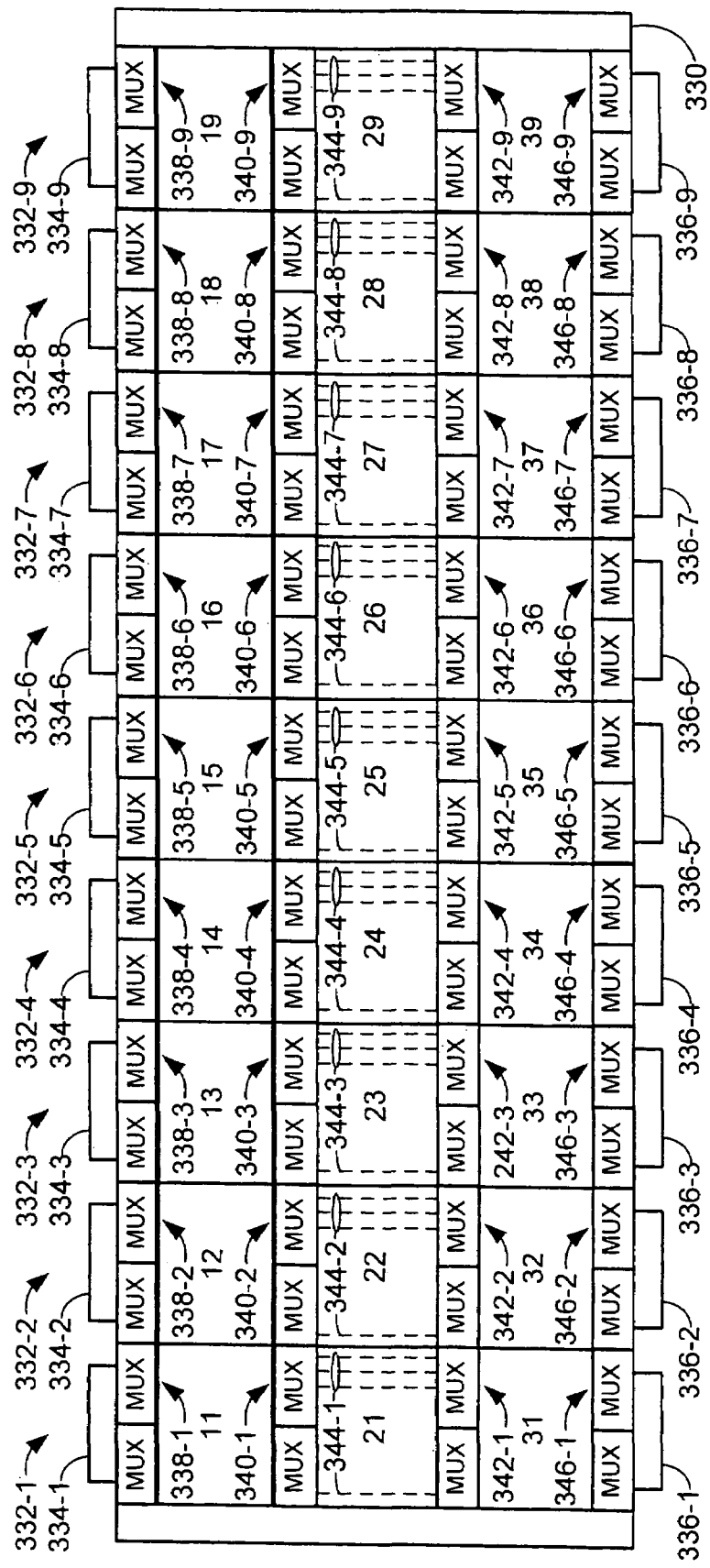
FIG. 17 illustrates a semiconductor that includes functional units with first, second, and third sub-functional units, switching devices, input and output pads, and established signal paths between sub-functional units according to the present invention.

Referring now to FIG. 17, an exemplary 8-port semiconductor 330 is fabricated with nine functioning ports 332-1 to 332-9. Pads 334-9 and 336-9, respectively, of the ninth port 332-9 may not be used. Additionally one or more switching devices X-1 and X-9 in the first or ninth physical port slice 332-1 and 332-9, respectively, may not be used since there are no adjacent ports to switch to. Each of the ports 332 includes a functional unit 332 with first, second, and third sub-functional units 1X, 2X, and 3X, respectively. First switching devices 338 between pads 334 and first sub-functional units 1X of the semiconductor 330 route signals from/to pads 334 to/from first sub-functional units 1X of adjacent physical port slices 332.

Second switching devices 340 that are located between the first and second sub-functional units 1X and 2X, respectively, route signals from/to the second sub-functional units 2X to/from the first sub-functional units 1X. Third switching devices 342 that are located between the second and third sub-functional units 2X and 3X, respectively, route signals from/to the first sub-functional units 1X to/from the third sub-functional units 3X. As discussed above, signals 344 from the first sub-functional units 1X to the third-functional units 3X are routed through second sub-functional units 2X of physical port slices with operable first sub-functional units 1X.

Fourth switches 346 between the third sub-functional units 3X and-the pads 336 route signals from/to the third sub-functional units 3X to/from the pads 336. In an exemplary embodiment there are two switching devices in each physical port slice 332 and between each of the sub-functional units 1X and 2X, and 2X and 3X and input and/or output ports 334 and 1X, and 3X and 336. This provides for two-way signal transmissions. In an exemplary embodiment each of the individual switching devices 338, 340, 342, and 346 is a multiplexer switch that selects an output from two or more different signal inputs. For example, a switching device 342-3 with a downward signal flow between second and third sub-functional units 23 and 33, respectively, in the third physical port slice 332-3 selectively routes output signals from one of sub-functional unit 12, 13, and 14 to sub-functional unit 33.

Figure 18:
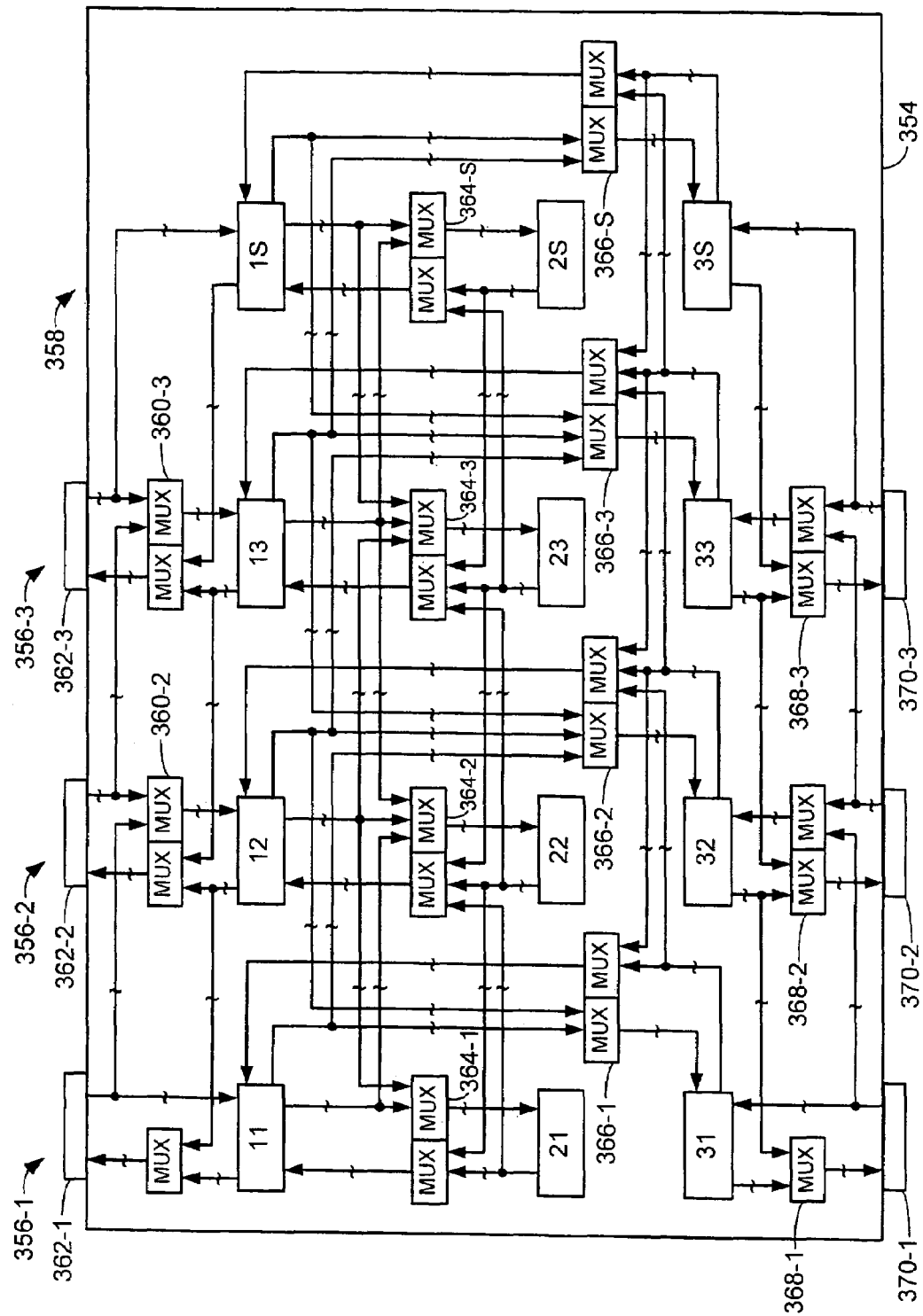
FIG. 18 is a functional block diagram of an exemplary three port self-reparable semiconductor that includes a spare functional unit and switching devices between sub-functional units, inputs pads, and output pads.

Referring now to FIG. 18, an exemplary 3-port semiconductor 354 is illustrated in further detail. The semiconductor 354 includes three functional units 356-1 to 356-3 and a spare functional unit 358. Switching devices 360-2 and 360-3 with a downward signal path that are located between the first sub-functional units 1X and the pads 362 route signals from the pads 362 to the first sub-functional unit 1X of the same physical port slice 356. For example, a switching device 360-2 with a downward signal path in the second physical port slice 356-2 may output a signal from either the input pad 362-1 of the first physical port slice 356-1 or the input pad 362-2 of the second physical port slice 356-2 to the first sub-functional unit 12 of the second physical port slice 356-2. Signals are similarly routed in the opposite direction.

Switching devices 364-1 to 364-3 and 364-S with a downward signal path that are located between the first sub-functional units 1X and the second sub-functional units 2X route signals from the one of the first sub-functional units 1X to the second sub-functional unit 2X of the same physical port slice 356. For example, a switching device 364-2 with a downward signal path in the second physical port slice 356-2 may output a signal from either of sub-functional units 11, 12, and 13 to sub-functional unit 22. Signals are similarly routed in the opposite direction.

Switching devices 366-1 to 366-3-and 366-S with a downward signal path that are located between the second sub-functional units 2X and the third sub-functional units 3X route signals from one of the first sub-functional units 1X to the third sub-functional unit 3X of the same physical port slice 356. For example, a switching device 366-2 with a downward signal path in the second physical port slice 356-2 may output a signal from either of sub-functional units 11, 12, and 13 to sub-functional unit 32. Signals are similarly routed in the opposite direction.

Switching devices 368-1 to 368-3 with a downward signal path that are located between the third sub-functional units 3X and the pads 370 route signals from one of the third sub-functional units 3X to the output pad 370 of the same physical port slice 356. For example, a switching device 368-2 with a downward signal path in the second physical port slice 356-2 may output a signal from either of sub-functional units 32 and 33 to the output pad 370-2 of the same physical port slice. Signals are similarly routed in the opposite direction.

Figure 19:
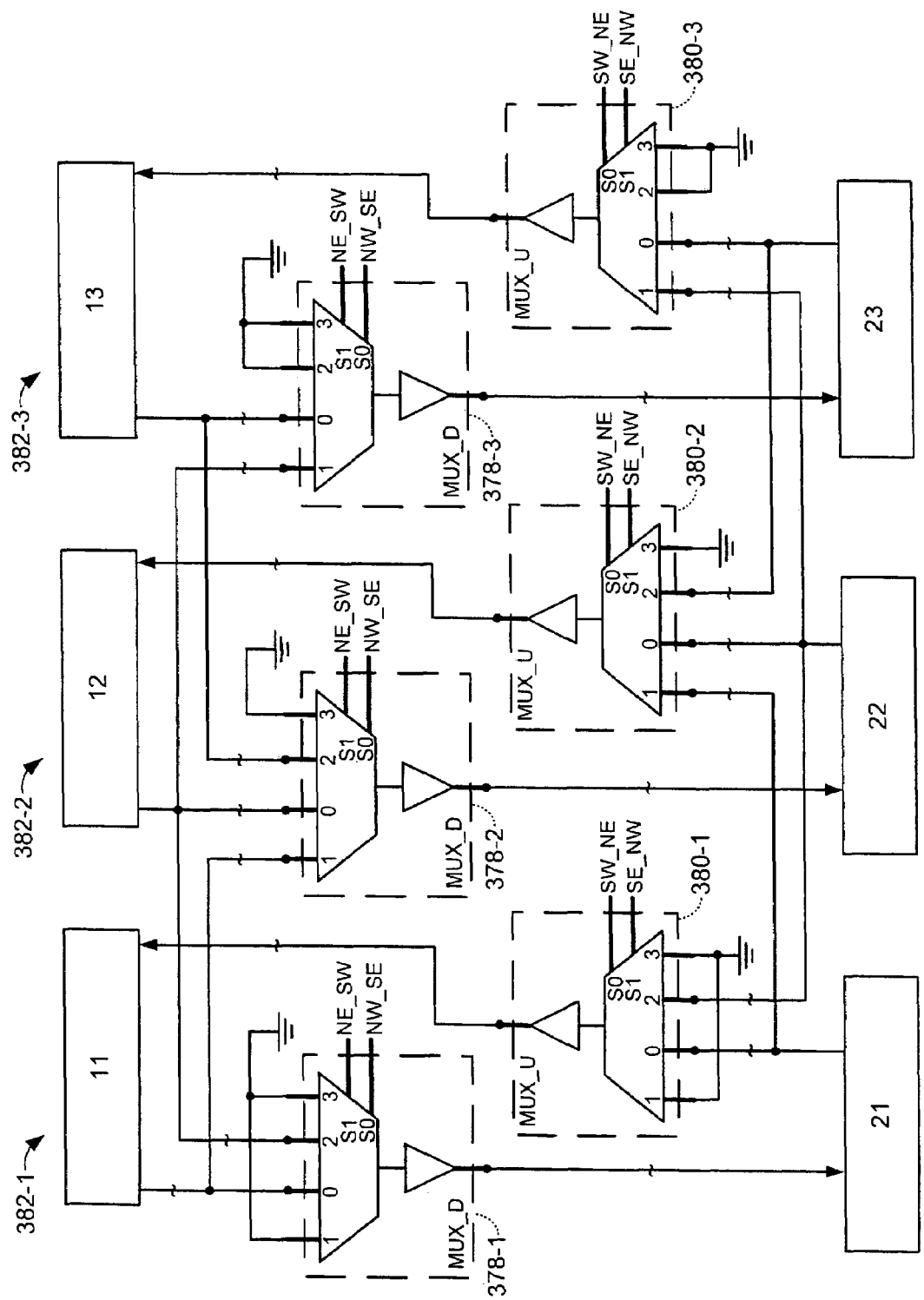
FIG. 19 is a functional block diagram of three functional units of a self-reparable semiconductor including multiplexer switching devices between respective first and second sub-functional units.

Referring now to FIG. 19, exemplary switching devices 378 and 380 that are located between the first and second sub-functional units 1X and 2X, respectively, and between the second and third sub-functional units 2X and 3X, respectively, are illustrated in further detail. The switching devices 378 and 380 comprise multiplexer switches that selectively output one of four input signals. The multiplexers 378 and 380 illustrated in FIG. 19 are 4-to-1 multiplexers that are controlled by first and second control signals NE_SW and NW_SE, and SW_NE and SE_NW, which will be explained in further detail below. While 4-to-1 multiplexers are shown, 3-to-1, 2-to-1 and/or M-to-1 (where M is an integer) multiplexers may be used-depending upon the number of inputs required.

In each of the multiplexer switches 378 with a downward signal flow, a "1" input receives an output signal from a sub-functional unit 1X that is in a left adjacent physical port slice 382. A "0" input receives an output signal from the sub-functional unit 1X of the current physical port slice 382. A "2" input receives an output signal from a sub-functional unit 1X that is-in a right adjacent physical port slice 382. Since each of the multiplexer switches 378 and 380 selects between three signals from sub-functional units 1X or 2X, the "3" input is tied to ground and not used. Signals are similarly routed in the opposite direction. Additionally, while the multiplexer switches 378 and 380 are shown located between the first and second sub-functional units 1X and 2X, respectively, multiplexer switches between the second and third sub-functional units 2X and 3X, respectively, are similarly connected.

Figures 20, 21:
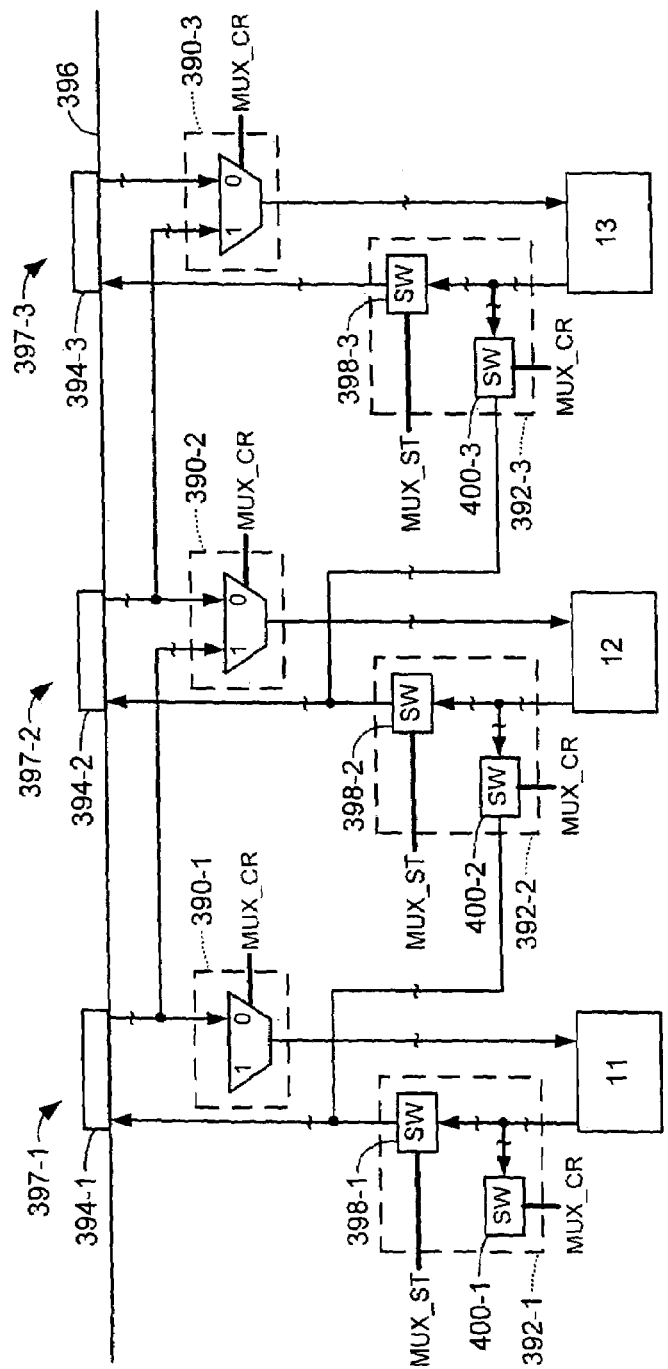
FIG. 20 is a functional block diagram of three functional units of a self-reparable semiconductor including multiplexer and dual switch switching devices between respective first sub-functional units and input pads.
FIG. 21 is a table that illustrates control signal combinations for switching devices between respective first sub-functional units and input pads and between respective third sub-functional units and output pads.

Referring now to FIG. 20, switching devices 390 and 392 that are located between the first sub-functional units 1X and the pads 394 of a semiconductor 396 are illustrated in further detail. The switching devices 390 illustrated with downward signal flow are multiplexer switches, and the switching devices 392 illustrated with an upward signal flow are dual switches. Either type of switching device 390 or 392 may be used exclusively or may be used instead of the other 392 or 390. The multiplexer switches 390 are 2-to-1 multiplexers that output one of two input signals based on a control signal MUX_CR. A "0" input receives an output signal from an input pad 394 of the same physical port slice 397. A "1" input receives an output signal from an input pad 394 of a left adjacent physical port slice 397.

The dual switches 392 include first and second switches 398 and 400, respectively, that cooperate to output a signal from a first sub-functional unit 1X to one of the pads 394 based on first and second control signals MUX_ST and MUX_CR, respectively. For example, the dual switches 392-2 in the second physical port slice 397-2 direct a signal from sub-functional unit 12 to either the input pad 394-2 in the same physical port slice 397-2 by opening the first switch 398-2 or the output pad 294-1 of the left adjacent physical port slice 397-1 by opening the second switch 400-2. Only one of the first and second switches 398 and 400, respectively, is open at any time, and both switches 398 and 400 are typically not closed at the same time.

Referring now to FIG. 21, a table includes control signal combinations for the switching devices 390 and 392 in FIG. 20. The switches 398 and 400 are open when respective control signals are set high and closed when respective control signals are set low. For the dual switches 392 in FIG. 20 with an upward signal flow, the first switch 398 is open when MUX_ST is set high. According to the table, signals from the first sub-functional units 1X are routed to respective pads 394 of the same physical port slice 397 when MUX_ST is set high. The second switch 400 is open when MUX_CR is set high. According to the table, signals from the first sub-functional units 1X are routed to pads 394 of left adjacent physical port slices. 397 when MUX_CR is set high. When both MUX_ST and MUX_CR are zero, data is not routed to the pads 394. A not-used combination occurs when both MUX_CR and MUX_ST set high.

Referring now to FIG. 22, switching devices 408 that are located between the third sub-functional units 3X and the pads 410 of the semiconductor 396 are illustrated in further detail. As those with an upward signal flow in FIG. 20, the switching devices 408 with a downward signal flow in FIG. 22 are dual switches. The first and second switches 412 and 414, respectively, cooperate to route signals that are output by the third sub-functional units 3X to the pads 410 based on the first and second control signals MUX_ST and MUX_CR, respectively. The control signal combinations in FIG. 21 also apply to the control signals MUX_ST and MUX_CR for the dual switches 408 in FIG. 22. In FIG. 20, the SW are tristate buffers that are used to route digital signals where the signal direction is uni-directional. In FIG. 22, the SW are CMOS switches use to pass analog signals that are bidirectional.

The first switches 412 are open when MUX_ST is set high, and signals from the third sub-functional units 3X are routed to respective pads 410 of the same physical port slices 397. The second switches 414 are open when MUX_CR is set high, and signals from the third sub-functional units 3X are routed to pads 410 of left adjacent physical port slices 397. While only switching devices 408 with a downward signal flow are illustrated in FIG. 22, a similar arrangement may exist with switching devices with an upward signal flow. Also, the dual switches 408 may be replaced with multiplexer switches.

1Referring now to FIG. 23A, a system comprises automated testing equipment (ATE) 420, a laser 422, and a self-reparable semiconductor 423 with a trimming circuit 424, a fuse circuit 426 and sub-functional units and switching devices (collectively 428). The ATE 420 tests the sub-functional units during a test mode and identifies inoperable sub-functional units (if any exist). The ATE 420 outputs the location of faulty sub-functional units to the laser 422, which makes or breaks a corresponding fuse in the fuse circuit 426. In a normal mode, the trimming circuit 424 uses the fuse circuit 426 to configure the switching devices, as will be described below.

Figure 23B:
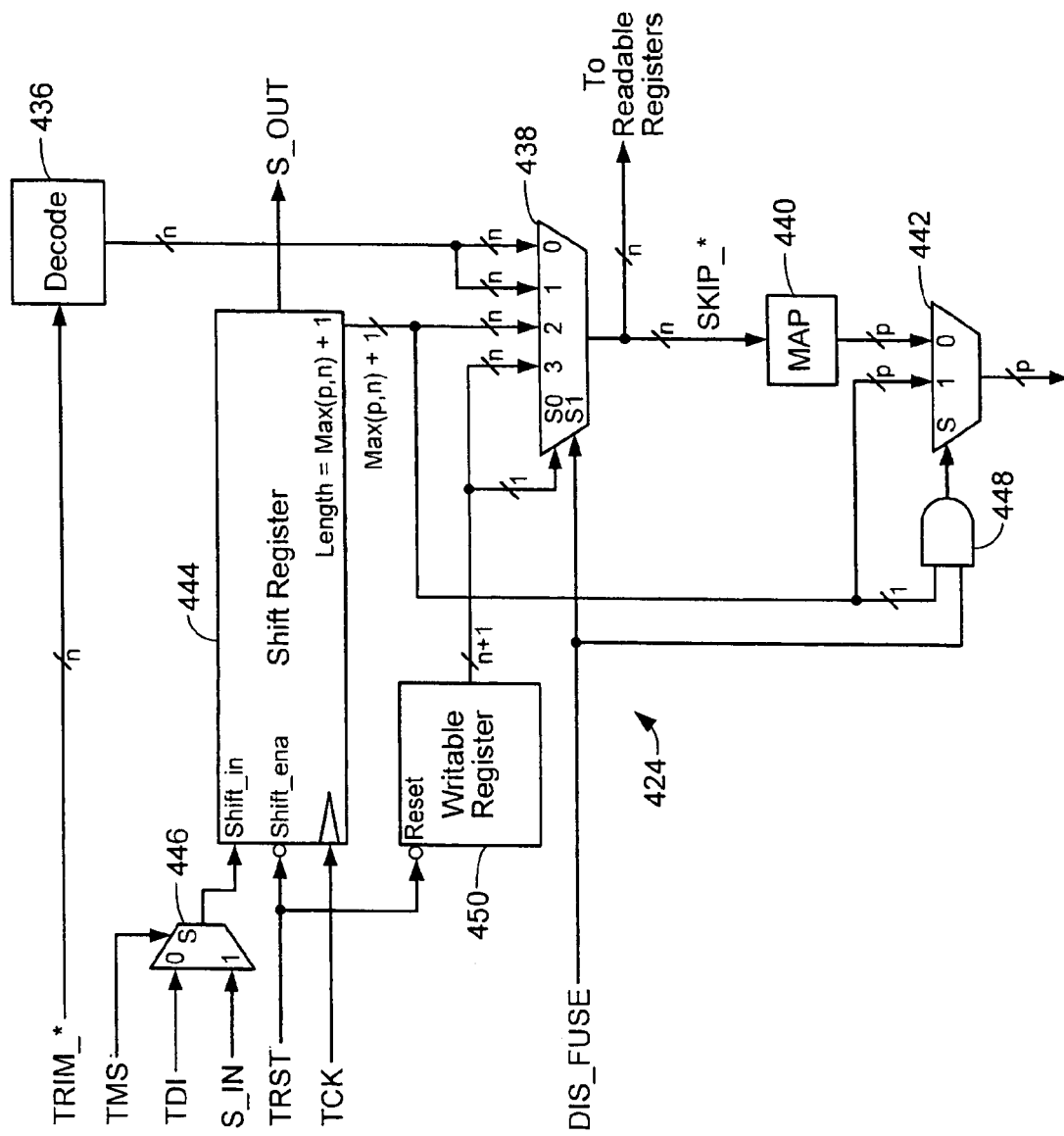

Referring now to FIG. 23B, the trimming circuit 424 is illustrated. After a testing process, the laser 422 may deactivate zero, one or more fuses in the fuse circuit 426 on the semiconductor 423, which sets the value of the TRIM_* signal. The "*" is a placeholder for sub-functions. In other words, if there are three sub-functions per functional unit, there will be TRIM_P1, TRIM_P2, and TRIM_P3 signals. An input of a decode module 436 receives the TRIM_* signal. The TRIM_* signal is an n-bit wide signal from the fuse circuit 426. The decode module 436 converts the TRIM_* signal into a binary-value that is between zero and eight. Each of the binary values corresponds to a physical port slice on the semiconductor 86 (assuming an 8-port semiconductor). First and second inputs of a first multiplexer switch 438 receive the binary value.

The input pad preferably has a pull-down resistor to ensure that a DIS_FUSE signal is set low by default. During normal operation, the DIS_FUSE signal is set low so that trimmed fuse values determine active groups on the semiconductor 86. However, during a testing process, the DIS_FUSE signal is set high so that the trimming circuit 424 can utilize one or more shift registers to transmit data in different patterns on the semiconductor 86 to detect inoperable sub-functional and/or functional units 92.

A second control signal of the first multiplexer switch 438 is set high by default. Therefore, when the DIS_FUSE signal is set low, the first multiplexer switch 438 outputs the binary value from the decode module 436. Binary decoding of the TRIM_* signal also simplifies mapping of the values of the TRIM_* signal. A map module 440 maps the values of the TRIM_* signal in a way that statistically minimizes the number of fuses that the laser is required to deactivate for the semiconductor 86 to operate desirably. The output of the first multiplexer switch 438 is also transmitted to registers that are readable by a management interface.

Automatic testing equipment (ATE) identifies sub-functional and/or functional units 92 in the semiconductor 86 that have no defects. To satisfactorily test analog portions of the semiconductor 86, sub-functional units 92 on the semiconductor 86 are arranged to form different logical port slices. Since deactivating fuses with a laser is permanent, it is desirable to form a variety of logical port slices without deactivating fuses in the fuse circuit 428 to test the integrity of the semiconductor 86.

A shift register 444 is used to minimize the probability of encountering a manufacturing defect in the shifter logic. A TCK signal provides a clock for the shift register 444. The shift register 444 clocks on the rising edge of the TCK signal. Data is shifted into the shift register 444 from a TDI signal. The shift register 444 includes one plus the larger of p and n bits of data. Since the TDI signal is input to a third multiplexer switch 446, a TMS signal that functions as a control signal for the third multiplexer switch 446 is typically set low. The shift register 444 is only enabled when a TRST signal is set low.

The shift register 444 has two modes of operation. In a direct mode, the shift register 444 outputs n bits to an input of the first multiplexer switch 438. The direct mode is utilized during ATE programming. When the n-bit signal from the shift register 444 is output by the first multiplexer switch 438, the n-bit signal is mapped by the map module 440. Shift registers 444 in all of the functional units 92 of the semiconductor 86 are simultaneously loaded with data from the TDI signal.

In the bypass mode, the first multiplexer switch 438 is bypassed and p bits that are output by the shift register 444 are input to the second multiplexer switch 442. Therefore, the map module 440 is also bypassed. An output of an AND gate 448 is determined by the DIS_FUSE signal and a high signal. The output of the AND gate 448 is the control signal for the second multiplexer switch 442. The TMS signal is set high during bypass mode. Therefore, data enters the shift register 444 from an S_IN signal. Bypass mode is utilized in the event that the map module 440 is defective. Shift registers 444 of adjacent physical port slices are connected in a daisy chain so that an output of an $N^{th}$ shift register 444 is received by an input of an $(N+1)^{th}$ shift register 444.

It may be useful to utilize a management interface to reconfigure the logical port slices during the testing process. In this case, the management interface utilizes a writable register 450. The writable register 450 receives the TRST signal as a reset signal. An input of the first multiplexer switch 438 receives an n-bit wide output from the writable register 450. In this case, the DIS_FUSE signal is set high so that the input of the first multiplexer switch 438 that receives the output from the writable register 450 is selected. After the DIS_FUSE signal is set high, the writable register 450 controls whether configuration data is generated by the writable register 450 or the fuses in the fuse circuit 428.

Referring now to FIG. 24, a table summarizes a mapping scheme that is implemented by the decode module 436. The decode module 436 maps values of the TRIM_* signal to corresponding SKIP_* values that designate a physical port slice. The fuse mapping is implemented in a way that minimizes the number of fuses that are deactivated for desirable operation. The value of TRIM[3:0] is assumed to be zero if a fuse is not deactivated and one if a fuse is deactivated. Unused TRIM[3:0] combinations are also mapped to binary values in order to avoid ambiguity in the event that there is a malfunction. The mapping of the unused combinations in FIG. 24 minimizes the required mapping logic.

When the ATE is used, SKIP[3:0] values are generated by shifting in data from the shift register 444. However, decoded TRIM[3:0] values are preferably used when using the laser to deactivate fuses. When no inoperable sub-functional units 92 are detected, it is most efficient to disable the spare functional unit. Therefore, when the value TRIM[3:0] is equal to 0000, port 8 is chosen as the disabled port. However, no actual fuse deactivation is required in this case.

Referring now to FIG. 25, a table summarizes trimming signals for the first, second, and third sub-functional units on the semiconductor 86. First sub-functional units correspond with block P1, second sub-functional units correspond with block P2, and third sub-functional units correspond with block P3. A given TRIM_PX[3:0] value has a corresponding SKIP_PX[3:0] according to the table in FIG. 24.

Referring now to FIG. 26, all ports on the semiconductor 86 have a hardwired input signal PORT_SLICE[3:0]. The value of PORT_SLICE[3:0] is between zero and eight and identifies a particular physical port slice number. Since the value of the SKIP_* signal identifies the physical port slice number of an inoperable sub-functional unit 92, PORT_SLICE[3:0] and SKIP_* are compared to determine logical port slice layouts.

The equations in FIG. 26 determine the value of control signals on the semiconductor 86 including control signals for the switching devices. The NE_SW, NW_SE, SW_NE, and SE_NW control signals determine how the multiplexer switches 378 and 380 between the first and second sub-functional units 1X and 2X, respectively, and between the first and third sub-functional units 1X and 3X, respectively, in FIG. 19 operate. The MUX_X control signals determine how the multiplexer switches 390 and dual switches 392 between the first sub-functional units and the pads 1X and 394, respectively, and between the third sub-functional units and the pads 3X and 410, respectively, in FIGS. 20 and 22 operate.

Referring now to FIG. 27, the values of the MUX_ST and MUX_CR control signals are determined by comparing the SKIP_* and PORT_SLICE values. For example, when SKIP_* is less than PORT_SLICE, the switching devices 390 and 392 between the first sub-functional units and the pads 1X and 394, respectively, route signals from the first sub-functional units 1X to left adjacent physical port slices 397. Likewise, the switching devices 408 between the third sub-functional units and the pads 3X and 410, respectively, route signals from the third sub-functional units 3X to left adjacent physical port slices 397. The shift direction is reversed for signals that travel in the opposite direction. Also, when SKIP_* is greater than PORT_SLICE, signals are not diverted.

Figures 28, 29, 30:
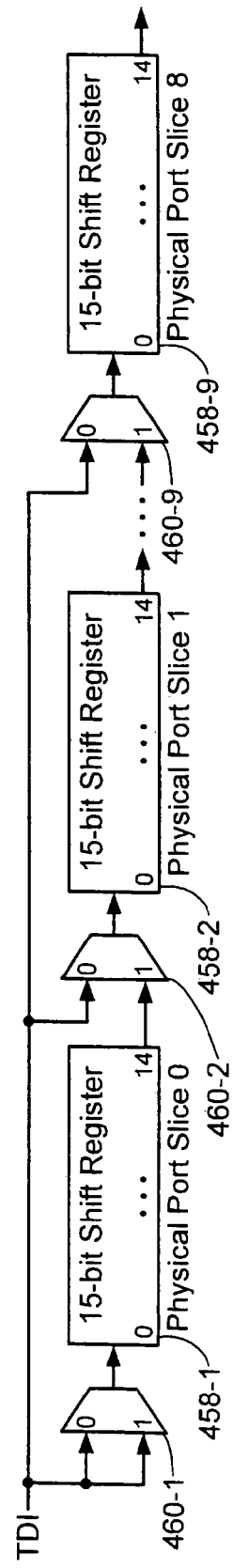
FIG. 28 is a table that illustrates downward signal flow between first and second sub-functional units and first and third sub-functional units and values of switching device control signals based on SKIP_TOP, SKIP_BOT, and PORT_SLICE signals.
FIG. 29 is a table that illustrates upward signal flow between third and first sub-functional units and second and first sub-functional units and values of switching device control signals based on SKIP_TOP, SKIP_BOT, and PORT_SLICE signals.
FIG. 30 is a functional block diagram of shift registers for functional units that are used to verify signal paths between sub-functional units and between sub-functional units and input and/or output pads.

Referring now to FIG. 28, the values of the NE_SW and NW_SE control signals are determined by comparing SKIP_TOP and SKIP_BOT values with PORT_SLICE values. The table in FIG. 28 determines the control signals for the multiplexer switches 378 located between the first and second sub-functional units 1X and 2X, respectively, and between the second and third sub-functional units 2X and 3X, respectively, with a downward signal flow. The multiplexer switches 378 route signals between the first and second sub-functional units 1X and 2X, respectively as in FIG. 19 and between the first and third sub-functional units 1X and 3X, respectively. For example, when NE_SW is equal to zero and when NW_SE is equal to one, a signal from a sub-functional unit 1X in a left adjacent physical port slice 382 is routed to a sub-functional unit 2X in the current physical port slice 382.

Referring now to FIG. 29, the values of the SE_NW and SW_NE control signals are determined by comparing SKIP_TOP and SKIP_BOT values with PORT_SLICE values. The table in FIG. 29 determines the control signals for multiplexer switches 380 with an upward signal flow located between the first and second sub-functional units 1X and 2X, respectively, and between the second and third sub-functional units 2X and 3X, respectively. The multiplexer switches 380 route signals between the second and first sub-functional units 2X and 1X, respectively as in FIG. 19 and between the third and first sub-functional units 3X and 1X, respectively. For example, when SE_NW is equal to one and when SW_NE is equal to zero, a signal from a sub-functional unit 2X in a right adjacent physical port slice 382 is routed to a sub-functional unit 1X in the current physical port slice 382.

Referring now to FIG. 30, an exemplary shift register implementation is shown. Each of the physical port slices includes a shift register 458 and a multiplexer switch 460. A first input of all of the multiplexer switches 460 receives the TDI signal. A second input of all of the multiplexer switches 460 receives an output from the preceding shift register 458. In the direct mode, all of the shift registers 458 are simultaneously loaded from the TDI signal. Thirteen bits are required to configure the shift registers 458 including twelve trimming bits and one control bit. However, in an exemplary embodiment, the shift registers 458 are 15-bit registers. Therefore, the upper two bits of each shift register 458 are not used during the direct mode.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. A self-reparable semiconductor, comprising:
   a first functional unit including first, second, and third sub-functional units that cooperate to perform a first function, wherein said first sub-functional unit communicates with said second sub-functional unit over a first signal path and communicates with said third sub-functional unit over a second signal path that passes through said second sub-functional unit;
   a first spare functional unit including first, second, and third sub-functional units, wherein said first, second, and third sub-functional units of said first functional unit and said first spare functional unit, respectively, are functionally interchangeable; and
   switching devices that communicate with said first, second, and third sub-functional units of said first functional unit and said first spare functional unit and that replace at least one of said first, second, and third sub-functional units of said first functional unit with at least one of said first, second, and third sub-functional units of said first spare functional unit when said at least one of said first, second, and third sub-functional units of said first functional unit is inoperable.

2. The self-reparable semiconductor of claim 1 further comprising a controller that identifies at least one inoperable sub-functional unit on said self-reparable semiconductor and that generates configuration data for configuring said switching devices to replace said at least one inoperable sub-functional unit.

3. The self-reparable semiconductor of claim 2 wherein said controller is located on said self-reparable semiconductor.

4. The self-reparable semiconductor of claim 2 wherein said controller is located off of said self-reparable semiconductor and further comprising memory that is located on said self-reparable semiconductor for storing said configuration data for said switching devices.

5. The self-reparable semiconductor of claim 1 wherein said first functional unit and said first spare functional unit are laid out in one of columns and rows on said self-reparable semiconductor and said first, second, and third sub-functional units of said first functional unit and said first spare functional unit are laid out in the other of columns and rows.

6. The self-reparable semiconductor of claim 1 further comprising a second functional unit that includes first, second, and third sub-functional units, wherein said first, second, and third sub-functional units of said first and second functional units, respectively, are functionally interchangeable and wherein said first spare functional unit is located one of between said first and second functional units and adjacent to one of said first or said second functional units.

7. The self-reparable semiconductor of claim 6 wherein said first, second, and first spare functional units are laid out in one of columns and rows on said self-reparable semiconductor and said first, second, and third sub-functional units of said first, second, and first spare functional units are laid out in the other of columns and rows.

8. The self-reparable semiconductor of claim 1 wherein said switching devices include at least one of analog and digital switching devices.

9. The self-reparable semiconductor of claim 1 wherein signals that are communicated between said first and third sub-functional units of at least one of said first functional unit and said first spare functional unit are routed through said second sub-functional unit of said at least one of said first functional unit and/or said first spare functional unit.

10. The self-reparable semiconductor of claim 1 further comprising one or more additional spare functional units.

11. A self-reparable semiconductor, comprising:
    a first functional unit including first, second, and third sub-functional units that cooperate to perform a first function, wherein said first sub-functional unit communicates with at least one of said second and/or third sub-functional units and said second sub-functional unit communicates with at least one of said first and/or third sub-functional units;
    a first spare functional unit including first, second, and third sub-functional units, wherein said first, second, and third sub-functional units of said first functional unit and said first spare functional unit, respectively, are functionally interchangeable; and
    switching devices that communicate with said first, second, and third sub-functional units of said first functional unit and said first spare functional unit and that replace at least one of said first, second, and third sub-functional units of said first functional unit with at least one of said first, second, and third sub-functional units of said first spare functional unit when said at least one of said first, second, and third sub-functional units of said first functional unit is inoperable,
    wherein at least one of said switching devices includes a multiplexer that receives y inputs and selectively outputs one of said y inputs.

12. The self-reparable semiconductor of claim 11 wherein said multiplexer receives output signals from first, second, and third sub-functional units that are functionally interchangeable.

13. A self-reparable semiconductor, comprising:
    a first functional unit including first, second, and third sub-functional units that cooperate to perform a first function, wherein said first sub-functional unit communicates with at least one of said second and/or third sub-functional units and said second sub-functional unit communicates with at least one of said first and/or third sub-functional units;

a first spare functional unit including first, second, and third sub-functional units, wherein said first, second, and third sub-functional units of said first functional unit and said first spare functional unit, respectively, are functionally interchangeable; and switching devices that communicate with said first, second, and third sub-functional units of said first functional unit and said first spare functional unit and that replace at least one of said first, second, and third sub-functional units of said first functional unit with at least one of said first, second, and third sub-functional units of said first spare functional unit when said at least one of said first, second, and third sub-functional units of said first functional unit is inoperable, wherein at least one of said switching devices includes first and second switches that receive an input and that selectively output said input based on first and second control signals, respectively.

14. The self-reparable semiconductor of claim 13 wherein said input is an output signal from one of a sub-functional unit and a pad of said self-reparable semiconductor.

15. A self-reparable semiconductor, comprising:

a first functional unit including first, second, and third sub-functional units that cooperate to perform a first function, wherein said first sub-functional unit communicates with at least one of said second and/or third sub-functional units and said second sub-functional unit communicates with at least one of said first and/or third sub-functional units;

a first spare functional unit including first, second, and third sub-functional units, wherein said first, second, and third sub-functional units of said first functional unit and said first spare functional unit, respectively, are functionally interchangeable; and switching devices that communicate with said first, second, and third sub-functional units of said first functional unit and said first spare functional unit and that replace at least one of said first, second, and third sub-functional units of said first functional unit with at least one of said first, second, and third sub-functional units of said first spare functional unit when said at least one of said first, second, and third sub-functional units of said first functional unit is inoperable, wherein said switching devices include at least one of analog and digital switching devices, and wherein said analog switching devices are current-based.

16. A system comprising:

a self-reparable semiconductor that includes:

M functional units that perform a function, where $M \geq 1$;

N spare functional units that perform said function and that are interchangeable with said M functional units, where $N \geq 1$; and switching devices that communicate with said M functional units and said N spare functional units and that selectively replace one of said M functional units with one of said N spare functional units when said one of said M functional units is inoperable;

automated testing equipment (ATE);

a fuse circuit associated with said self reparable semiconductor that includes a plurality of fuses that selectively store a location of at least one inoperable functional unit; and a trimming circuit associated with said self-reparable semiconductor that interfaces with said ATE and said fuse circuit.

17. The system of claim 16 wherein said trimming circuit has normal and testing modes.

18. The system of claim 17 wherein said trimming circuit allows said ATE to override said fuse circuit to select and test said functional units during said test mode.

19. The system of claim 18 wherein said switching devices are selectively configured based on said location of said at least one inoperable functional unit during said normal mode.

20. A self-reparable semiconductor, comprising:

M functional units each including first, second, and third sub-functional units, wherein each of said M functional units perform the same function, wherein M is greater than or equal to 1, wherein each corresponding ones of said first, second, and third sub-functional units perform the same function, and wherein corresponding ones of said first sub-functional units communicate with corresponding ones of said second sub-functional units over respective first signal paths and communicate with corresponding ones of said third sub-functional units over respective second signal paths that pass through said second sub-functional units;

a first spare functional unit including X sub-functional units, wherein X is greater than or equal to one and wherein said X sub-functional units of said first spare functional unit are functionally interchangeable with corresponding sub-functional units of said M functional units; and a plurality of switching devices that replace at least one of said first, second, and third sub-functional units of said M functional units with at least one of said X sub-functional units when said at least one of said first, second, and third sub-functional units of said M functional units is inoperable.

21. The self-reparable semiconductor of claim 20 further comprising a controller that identifies at least one inoperable sub-functional unit and that generates configuration data for configuring said plurality of switching devices to replace said at least one inoperable sub-functional unit.

22. The self-reparable semiconductor of claim 21 wherein said controller is located on said self-reparable semiconductor.

23. The self-reparable semiconductor of claim 21 wherein said controller is located off of said self-reparable semiconductor and further comprising memory that is located on said self-reparable semiconductor for storing said configuration data for said switching devices.

24. The self-reparable semiconductor of claim 20 wherein said first spare functional unit is located one of between two of said M functional units, adjacent only to a first of said M functional units, and adjacent only to an $M^{th}$ of said M functional units.

25. The self-reparable semiconductor of claim 20 wherein said M functional units and said first spare functional unit are laid out in one of columns and rows on said self-reparable semiconductor and said first, second, and third sub-functional units of said M functional units and said X sub-functional units of said first spare functional unit are laid out in the other of columns and rows.

26. The self-reparable semiconductor of claim 20 wherein said plurality of switching devices include at least one of analog and digital switching devices.

27. The self-reparable semiconductor of claim 20 wherein signals that are communicated between said first and third sub-functional units of said M functional units are routed through said second sub-functional unit of said M functional units.

28. A system comprising:
a self-reparable semiconductor that includes:
M functional units that perform a function, where M>1;
N spare functional units that perform said function and that are interchangeable with said M functional units, where N>1; and
switching devices that communicate with said M functional units and said N spare functional units and that selectively replace one of said M functional units with one of said N spare functional units when said one of said M functional units is inoperable;
automated testing equipment (ATE);
a fuse circuit associated with said self reparable semiconductor that includes a plurality of fuses that selectively store a location of at least one inoperable functional unit; and
a trimming circuit associated with said self-reparable semiconductor that interfaces with said ATE and said fuse circuit,
wherein at least one of said plurality of switching devices includes a multiplexer that receives p inputs and selectively outputs one of said p inputs.

29. The self-reparable semiconductor of claim 28 wherein said multiplexer receives at least three inputs that include output signals from first, second, and third sub-functional units that are functionally interchangeable, and wherein said multiplexer selectively outputs one of said output signals based on first and second control signals.

30. A system comprising:
a self-reparable semiconductor that includes:
M functional units that perform a function, where M>1;
N spare functional units that perform said function and that are interchangeable with said M functional units, where N>1; and
switching devices that communicate with said M functional units and said N spare functional units and that selectively replace one of said M functional units with one of said N spare functional units when said one of said M functional units is inoperable;
automated testing equipment (ATE);
a fuse circuit associated with said self reparable semiconductor that includes a plurality of fuses that selectively store a location of at least one inoperable functional unit; and
a trimming circuit associated with said self-reparable semiconductor that interfaces with said ATE and said fuse circuit,
wherein at least one of said switching devices includes first and second switches that receive an input and that selectively output said input based on first and second control signals, respectively.

31. The self-reparable semiconductor of claim 30 wherein said input is an output signal from one of a sub-functional unit and a pad of said self-reparable semiconductor.

32. A system comprising:
a self-reparable semiconductor that includes:
M functional units that perform a function, where M>1;
N spare functional units that perform said function and that are interchangeable with said M functional units, where N>1; and
switching devices that communicate with said M functional units and said N spare functional units and that selectively replace one of said M functional units with one of said N spare functional units when said one of said M functional units is inoperable;
automated testing equipment (ATE);
a fuse circuit associated with said self reparable semiconductor that includes a plurality of fuses that selectively store a location of at least one inoperable functional unit; and
a trimming circuit associated with said self-reparable semiconductor that interfaces with said ATE and said fuse circuit,
wherein said plurality of switching devices include at least one of analog and digital switching devices, and
wherein said analog switching devices are current-based.

33. A self-reparable semiconductor, comprising:
first functional means for performing a first function and including first, second, and third sub-functional means for performing first, second and third functions and that cooperate to perform said first function, wherein said first sub-functional means communicates with said second sub-functional means over a first signal path and communicates with said third sub-functional means over a second signal path that passes through said second sub-functional means;
first spare functional means for selectively replacing inoperable sub-functional means and including first, second, and third sub-functional means for performing first, second and third functions, respectively, wherein said first, second, and third sub-functional means of said first functional means and said first spare functional means, respectively, are functionally interchangeable; and
switching means for switching that communicates with said first, second, and third sub-functional means of said first functional means and said first spare functional means and that replaces at least one of said first, second, and third sub-functional means of said first functional means with at least one of said first, second, and third sub-functional means of said first spare functional means when said at least one of said first, second, and third sub-functional means of said first functional means is inoperable.

34. The self-reparable semiconductor of claim 33 further comprising control means for identifying at least one inoperable sub-functional means and for generating configuration data for configuring said switching means to replace said at least one inoperable sub-functional means.

35. The self-reparable semiconductor of claim 34 wherein said control means is located on said self-reparable semiconductor.

36. The self-reparable semiconductor of claim 34 wherein said control means is located off of said self-reparable semiconductor and further comprising storing means that is located on said self-reparable semiconductor for storing said configuration data for said switching means.

37. The self-reparable semiconductor of claim 33 wherein said first functional means and said first spare functional means are laid out in one of columns and rows on said self-reparable semiconductor and said first, second, and third sub-functional means of said first functional means and said first spare functional means are laid out in the other of columns and rows.

38. The self-reparable semiconductor of claim 33 further comprising second functional means that includes first, second, and third sub-functional means, wherein said first, second, and third sub-functional means of said first and second functional means, respectively, are functionally interchangeable and wherein said first spare functional means is located one of between said first and second functional means and adjacent to only one of said first and said second functional means.

39. The self-reparable semiconductor of claim 38 wherein said first, second, and first spare functional means are laid out in one of columns and rows on said self-reparable semiconductor and said first, second, and third sub-functional means of said first, second, and first spare functional means are laid out in the other of columns and rows.

40. The self-reparable semiconductor of claim 33 wherein said switching means include at least one of analog and digital switches.

41. The self-reparable semiconductor of claim 33 wherein signals that are communicated between said first and third sub-functional means of at least one of said first functional means and said first spare functional means are routed through said second sub-functional means of said at least one of said first functional means and/or said first spare functional means.

42. The self-reparable semiconductor of claim 33 further comprising one or more additional spare functional means.

43. A self-reparable semiconductor, comprising:
  first functional means for performing a first function and including first, second, and third sub-functional means for performing first, second and third functions and that cooperate to perform said first function, wherein said first sub-functional means communicates with at least one of said second and/or third sub-functional means and said second sub-functional means communicates with at least one of said first and/or third sub-functional means;
  first spare functional means for selectively replacing inoperable sub-functional means and including first, second, and third sub-functional means for performing first, second and third functions, respectively, wherein said first, second, and third sub-functional means of said first functional means and said first spare functional means, respectively, are functionally interchangeable; and
  switching means for switching that communicates with said first, second, and third sub-functional means of said first functional means and said first spare functional means and that replaces at least one of said first, second, and third sub-functional means of said first functional means with at least one of said first, second, and third sub-functional means of said first spare functional means when said at least one of said first, second, and third sub-functional means of said first functional means is inoperable,
  wherein at least one of said switching means includes multiplexing means for receiving y inputs and selectively outputting one of said y inputs.

44. The self-reparable semiconductor of claim 43 wherein said multiplexing means receives output signals from first, second, and third sub-functional means that are functionally interchangeable.

45. A self-reparable semiconductor, comprising:
  first functional means for performing a first function and including first, second, and third sub-functional means for performing first, second and third functions and that cooperate to perform said first function, wherein said first sub-functional means communicates with at least one of said second and/or third sub-functional means and said second sub-functional means communicates with at least one of said first and/or third sub-functional means;
  first spare functional means for selectively replacing inoperable sub-functional means and including first, second, and third sub-functional means for performing first, second and third functions, respectively, wherein said first, second, and third sub-functional means of said first functional means and said first spare functional means, respectively, are functionally interchangeable; and
  switching means for switching that communicates with said first, second, and third sub-functional means of said first functional means and said first spare functional means and that replaces at least one of said first, second, and third sub-functional means of said first functional means with at least one of said first, second, and third sub-functional means of said first spare functional means when said at least one of said first, second, and third sub-functional means of said first functional means is inoperable,
  wherein at least one of said switching means includes first and second switches that receive an input and that selectively output said input based on first and second control signals, respectively.

46. The self-reparable semiconductor of claim 45 wherein said input is an output signal from one of a sub-functional means and a pad of said self-reparable semiconductor.

47. A self-reparable semiconductor, comprising:
  first functional means for performing a first function and including first, second, and third sub-functional means for performing first, second and third functions and that cooperate to perform said first function, wherein said first sub-functional means communicates with at least one of said second and/or third sub-functional means and said second sub-functional means communicates with at least one of said first and/or third sub-functional means;
  first spare functional means for selectively replacing inoperable sub-functional means and including first, second, and third sub-functional means for performing first, second and third functions, respectively, wherein said first, second, and third sub-functional means of said first functional means and said first spare functional means, respectively, are functionally interchangeable; and
  switching means for switching that communicates with said first, second, and third sub-functional means of said first functional means and said first spare functional means and that replaces at least one of said first, second, and third sub-functional means of said first functional means with at least one of said first, second, and third sub-functional means of said first spare functional means when said at least one of said first, second, and third sub-functional means of said first functional means is inoperable,
  wherein said switching means include at least one of analog and digital switches, and
  wherein said analog switches are current-based.

48. A system comprising:
  a self-reparable semiconductor that includes:
    M functional means for performing a function, where $M \geq 1$;

N spare functional means for replacing inoperable functional means and that are interchangeable with said M functional means, where N≧1; and switching means for switching that communicates with said M functional means and said N spare functional means and that selectively replaces one of said M functional means with one of said N spare functional means when said one of said M functional means is inoperable;

testing means for testing;

fuse means associated with said self reparable semiconductor that includes for selectively storing a location of at least one inoperable functional means; and trimming means associated with said self-reparable semiconductor that interfaces with said testing means and said fuse means.

49. The system of claim 48 wherein said trimming means has normal and testing modes.

50. The system of claim 49 wherein said trimming circuit allows said testing means to override said fuse means to select and test said functional means during said test mode.

51. The system of claim 50 wherein said switching means are selectively configured based on said location of said at least one inoperable functional unit during said normal mode.

52. A self-reparable semiconductor, comprising:

M functional means for performing a function each including first, second, and third sub-functional means for performing first, second and third sub-functions wherein each of said M functional means perform the same function, wherein M is greater than or equal to 1, wherein each corresponding ones of said first, second, and third sub-functional means perform the same function, and wherein corresponding ones of said first sub-functional means communicate with of corresponding ones of said second sub-functional means over respective first signal paths and communicate with corresponding ones of said third sub-functional means over respective second signal paths that pass through said second sub-functional means;

first spare functional means for replacing inoperable sub-functional means and including X sub-functional means for performing sub-functions, wherein X is greater than or equal to one and wherein said X sub-functional means of said first spare functional means are functionally interchangeable with corresponding sub-functional means of said M functional means; and a plurality of switching means for replacing at least one of said first, second, and third sub-functional means of said M functional means with at least one of said X sub-functional means when said at least one of said first, second, and third sub-functional means of said M functional means is inoperable.

53. The self-reparable semiconductor of claim 52 further comprising control means for identifying at least one inoperable sub-functional means and for generating configuration data for configuring said plurality of switching means to replace said at least one inoperable sub-functional means.

54. The self-reparable semiconductor of claim 53 wherein said control means is located on said self-reparable semiconductor.

55. The self-reparable semiconductor of claim 53 wherein said control means is located off of said self-reparable semiconductor and further comprising storing means that is located on said self-reparable semiconductor for storing said configuration data for said switching means.

56. The self-reparable semiconductor of claim 52 wherein said first spare functional means is located one of between two of said M functional means, adjacent only to a first of said M functional means, and adjacent only to an $M^{th}$ of said M functional means.

57. The self-reparable semiconductor of claim 52 wherein said M functional means and said first spare functional means are laid out in one of columns and rows on said self-reparable semiconductor and said first, second, and third sub-functional means of said M functional means and said X sub-functional means of said first spare functional means are laid out in the other of columns and rows.

58. The self-reparable semiconductor of claim 52 wherein said plurality of switching means include at least one of analog and digital switches.

59. The self-reparable semiconductor of claim 52 wherein signals that are communicated between said first and third sub-functional means of said M functional means are routed through said second sub-functional means of said M functional means.

60. A self-reparable semiconductor, comprising:

M functional means for performing a function each including first, second, and third sub-functional means for performing first, second and third sub-functions, wherein each of said M functional means perform the same function, wherein M is greater than or equal to 1, wherein each corresponding ones of said first, second, and third sub-functional means perform the same function, and wherein corresponding ones of said first sub-functional means communicate with at least one of corresponding ones of said second and/or third sub-functional means and corresponding ones of said second sub-functional means communicate with at least one of corresponding ones of said first and/or third sub-functional means;

first spare functional means for replacing inoperable sub-functional means and including X sub-functional means for performing sub-functions, wherein X is greater than or equal to one and wherein said X sub-functional means of said first spare functional means are functionally interchangeable with corresponding sub-functional means of said M functional means; and a plurality of switching means for replacing at least one of said first, second, and third sub-functional means of said M functional means with at least one of said X sub-functional means when said at least one of said first, second, and third sub-functional means of said M functional means is inoperable, wherein at least one of said plurality of switching means includes multiplexing means for receiving p inputs and selectively outputting one of said p inputs.

61. The self-reparable semiconductor of claim 60 wherein said multiplexing means receives at least three inputs that include output signals from first, second, and third sub-functional means that are functionally interchangeable, and wherein said multiplexer selectively outputs one of said output signals based on first and second control signals.

62. A self-reparable semiconductor, comprising:

M functional means for performing a function each including first, second, and third sub-functional means for performing first, second and third sub-functions, wherein each of said M functional means perform the same function, wherein M is greater than or equal to 1, wherein each corresponding ones of said first, second, and third sub-functional means perform the same function, and wherein corresponding ones of said first sub-functional means communicate with at least one of corresponding ones of said second and/or third sub-functional means and corresponding ones of said second sub-functional means communicate with at least one of corresponding ones of said first and/or third sub-functional means;

first spare functional means for replacing inoperable sub-functional means and including X sub-functional means for performing sub-functions, wherein X is greater than or equal to one and wherein said X sub-functional means of said first spare functional means are functionally interchangeable with corresponding sub-functional means of said M functional means; and a plurality of switching means for replacing at least one of said first, second, and third sub-functional means of said M functional means with at least one of said X sub-functional means when said at least one of said first, second, and third sub-functional means of said M functional means is inoperable, wherein at least one of said switching means includes first and second switches that both receive an input and that selectively output said input based on first and second control signals, respectively.

63. The self-reparable semiconductor of claim 62 wherein said input is an output signal from one of sub-functional means and a pad of said self-reparable semiconductor.

64. A self-reparable semiconductor, comprising:

M functional means for performing a function each including first, second, and third sub-functional means for performing first, second and third sub-functions, wherein each of said M functional means perform the same function, wherein M is greater than or equal to 1, wherein each corresponding ones of said first, second, and third sub-functional means perform the same function, and wherein corresponding ones of said first sub-functional means communicate with at least one of corresponding ones of said second and/or third sub-functional means and corresponding ones of said second sub-functional means communicate with at least one of corresponding ones of said first and/or third sub-functional means;

first spare functional means for replacing inoperable sub-functional means and including X sub-functional means for performing sub-functions, wherein X is greater than or equal to one and wherein said X sub-functional means of said first spare functional means are functionally interchangeable with corresponding sub-functional means of said M functional means; and a plurality of switching means for replacing at least one of said first, second, and third sub-functional means of said M functional means with at least one of said X sub-functional means when said at least one of said first, second, and third sub-functional means of said M functional means is inoperable, wherein said plurality of switching means include at least one of analog and digital switches, wherein said analog switches are current-based.

65. A method for operating a self-reparable semiconductor, comprising:

providing a first functional unit including first, second, and third sub-functional units that cooperate to perform a first function, wherein said first sub-functional unit communicates with said second sub-functional unit over a first signal oath and communicates with said third sub-functional units over a second signal path that passes through said second sub-functional unit;

providing a first spare functional unit including first, second, and third sub-functional units, and wherein said first, second, and third sub-functional units of said first functional unit and said first spare functional unit, respectively, are functionally interchangeable; and replacing at least one of said first, second, and third sub-functional units of said first functional unit with at least one of said first, second, and third sub-functional units of said first spare functional unit when said at least one of said first, second, and third sub-functional units of said first functional unit is inoperable.

66. The method of claim 65 further comprising:

identifying at least one inoperable sub-functional unit; and generating configuration data to replace said at least one inoperable sub-functional unit.

67. The method of claim 66 further comprising storing said configuration data on said self-reparable semiconductor.

68. The method of claim 65 further comprising laying out said first functional unit and said first spare functional unit in one of columns and rows on said self-reparable semiconductor and said first, second, and third sub-functional units of said first functional unit and said first spare functional unit in the other of columns and rows.

69. The method of claim 65 further comprising:

providing a second functional unit that includes first, second, and third sub-functional units, wherein said first, second, and third sub-functional units of said first and second functional units, respectively, are functionally interchangeable; and locating said first spare functional unit one of between said first and second functional units and adjacent to one of said first and said second functional units.

70. The method of claim 69 further comprising laying out said first, second, and first spare functional units in one of columns and rows on said self-reparable semiconductor and said first, second, and third sub-functional units of said first, second, and first spare functional units in the other of columns and rows.

71. The method of claim 65 further comprising routing signals that are communicated between said first and third sub-functional units of at least one of said first functional unit and said first spare functional unit through said second sub-functional unit of said at least one of said first functional unit and/or said first spare functional unit.

72. A method for operating a self-reparable semiconductor, comprising:

providing M functional units each including first, second, and third sub-functional units, wherein each of said M functional units perform the same function, wherein M is greater than or equal to 1, wherein each corresponding ones of said first, second, and third sub-functional units perform the same function, and wherein corresponding ones of said first sub-functional units communicate with corresponding ones of said second sub-functional units over respective first signal paths and communicate with corresponding ones of said third sub-functional units over respective second signal paths that pass through said second sub-functional units;

providing a first spare functional unit including X sub-functional units, wherein X is greater than or equal to one and wherein said X sub-functional units of said first spare functional unit are functionally interchangeable with corresponding sub-functional units of said M functional units; and replacing at least one of said first, second, and third sub-functional units of said M functional units with at least one of said X sub-functional units when said at least one of said first, second, and third sub-functional units of said M functional units is inoperable.

73. The method of claim 72 further comprising:

identifying at least one inoperable sub-functional unit on said self-reparable semiconductor; and generating configuration data to replace said at least one inoperable sub-functional unit.

74. The method of claim 72 further comprising locating said first spare functional unit one of between two of said M functional units, adjacent only to a first of said M functional units, and adjacent only to an $M^{th}$ of said M functional units.

75. The method of claim 72 further comprising laying out said M functional units and said first spare functional unit in one of columns and rows on said self-reparable semiconductor and said first, second, and third sub-functional units of said M functional units and said X sub-functional units of said first spare functional unit in the other of columns and rows.

76. The method of claim 72 further comprising routing signals that are communicated between said first and third sub-functional units of said M functional units through said second sub-functional unit of said M functional units.

* * * * *

UNITED STATES PATENT AND TRADEMARK OFFICE
CERTIFICATE OF CORRECTION

PATENT NO. : 7,340,644 B2  Page 1 of 1
APPLICATION NO. : 10/892707
DATED : March 4, 2008
INVENTOR(S) : Sehat Sutardja et al.

It is certified that error appears in the above-identified patent and that said Letters Patent is hereby corrected as shown below:

| | |
|---|---|
| Column 1, Line 47 | Delete "PQS" and insert -- PCS -- |
| Column 6, Line 23 | Delete " ' " after "the" |
| Column 6, Line 52 | Delete "-" after "replacement" |
| Column 6, Line 61 | Delete "-" before "13" |
| Column 8, Line 42 | Delete "1-2" and insert -- 12 -- |
| Column 8, Line 61 | Delete "-data" and insert -- data -- |
| Column 11, Line 51 | Delete "Until" and insert -- unit -- |
| Column 13, Line 58 | Delete "-" between "and" and "the" |
| Column 14, Line 30 | Delete "-" after "366-3" |
| Column 15, Line 3 | Delete "-" between "is" and "in" |
| Column 16, Line 3 | Delete "use" and insert -- used -- |
| Column 16, Line 16 | Delete "1Referring" and insert -- Referring -- |
| Column 16, Line 38 | Delete "-" between "binary" and "value" |
| Column 27, Line 35 | Delete "of" after "with" |
| Column 29, Line 67 | Delete "oath" and insert -- path -- |

Signed and Sealed this

Twenty-fourth Day of March, 2009

JOHN DOLL
*Acting Director of the United States Patent and Trademark Office*